United States Patent [19]
Aruga et al.

[11] Patent Number: 5,798,651
[45] Date of Patent: Aug. 25, 1998

[54] PROBE SYSTEM

[75] Inventors: Tsuyoshi Aruga; Wataru Mochizuki; Shuji Akiyama, all of Kofu; Hisatomi Hosaka, Nirasaki; Yuichi Abe, Hachioji, all of Japan

[73] Assignee: Tokyo Electron Limited, Tokyo, Japan

[21] Appl. No.: 661,405

[22] Filed: Jun. 7, 1996

[30] Foreign Application Priority Data

Jun. 8, 1995 [JP] Japan .................................. 7-166879
Mar. 11, 1996 [JP] Japan .................................. 8-082039

[51] Int. Cl.$^6$ .................................. G01R 31/02
[52] U.S. Cl. .................................. 324/754; 324/158.1
[58] Field of Search .................................. 324/754, 758, 324/760, 158.1; 414/222; 209/573

[56] References Cited

U.S. PATENT DOCUMENTS

| | | | |
|---|---|---|---|
| 4,639,664 | 1/1987 | Chiu et al. | 324/73 |
| 4,900,939 | 2/1990 | Aoyama | 250/548 |
| 5,488,292 | 1/1996 | Tsuta | 324/158.1 |
| 5,510,724 | 4/1996 | Itoyama et al. | 324/760 |

FOREIGN PATENT DOCUMENTS 3-289152 12/1991 Japan .
4-65850 3/1992 Japan .
5-343497 12/1993 Japan .

Primary Examiner—Ernest F. Karlsen
Assistant Examiner—Anh Phung
Attorney, Agent, or Firm—Oblon, Spivak, McClelland, Maier & Neustadt, P.C.

[57] ABSTRACT

A probe system according to the present invention has a plurality of exploration portions disposed in a line, spaced apart from one another for predetermined distances and each having a test head, for establishing electrical connection between the test head and electrodes of a subject of exploration so as to explore electrical characteristics of the subject of exploration, a conveyance passage running parallel to the line of the exploration portions, a retainer portion on which a plurality of the subjects of exploration are placed, which is facing to the conveyance passage and which is capable of elevating vertical with respect to the conveyance passage at a position above the conveyance passage, and delivery and acceptance unit arranged capable of moving along the conveyance passage and arranged to deliver and accept the subjects of exploration between the retainer portion and each of the exploration portions.

17 Claims, 17 Drawing Sheets

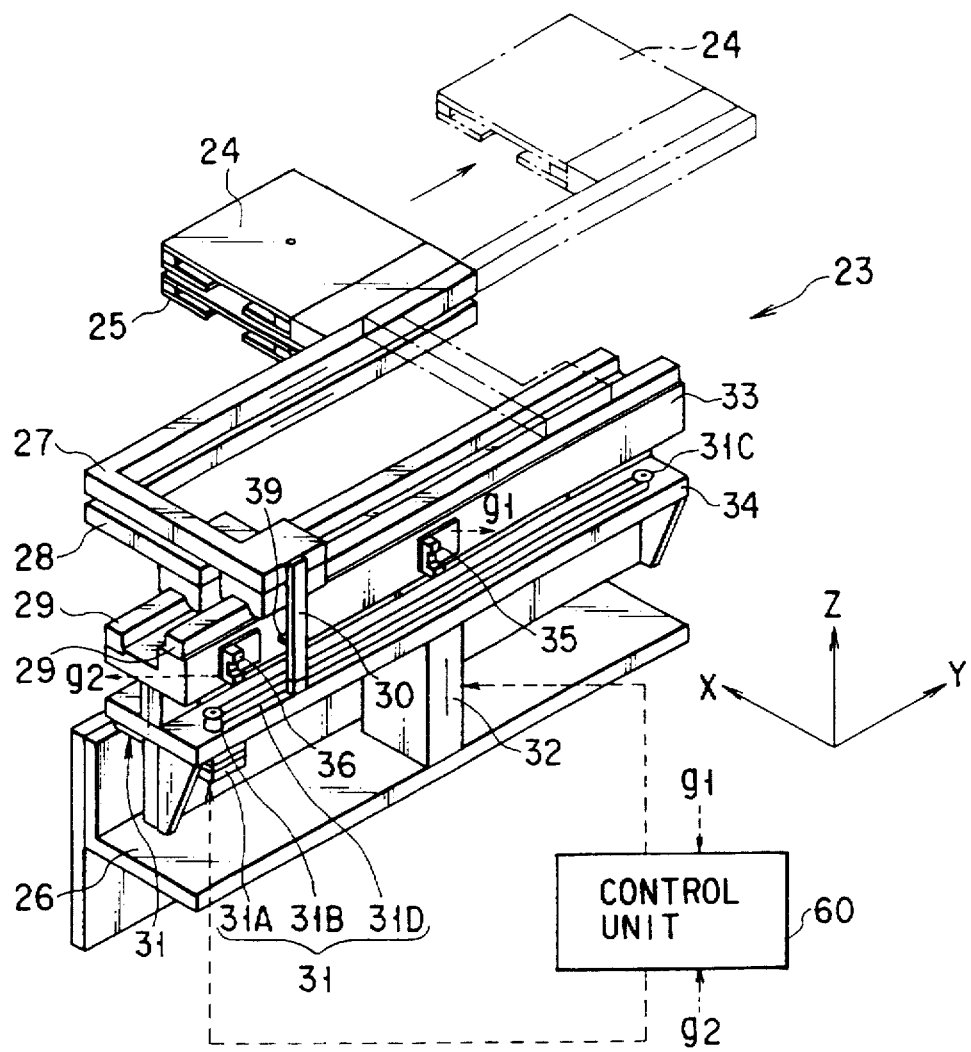
F I G. 5
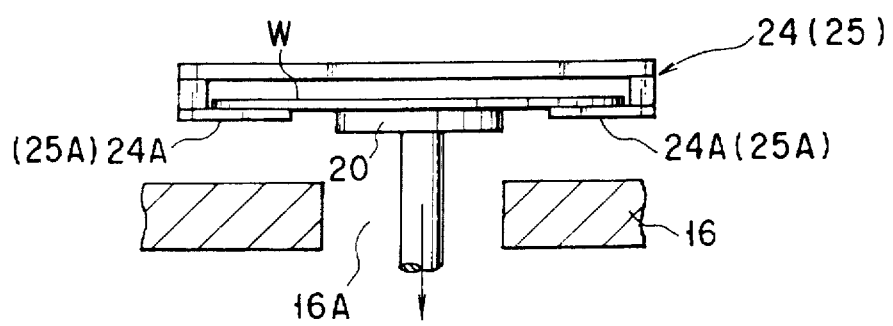
F I G. 6

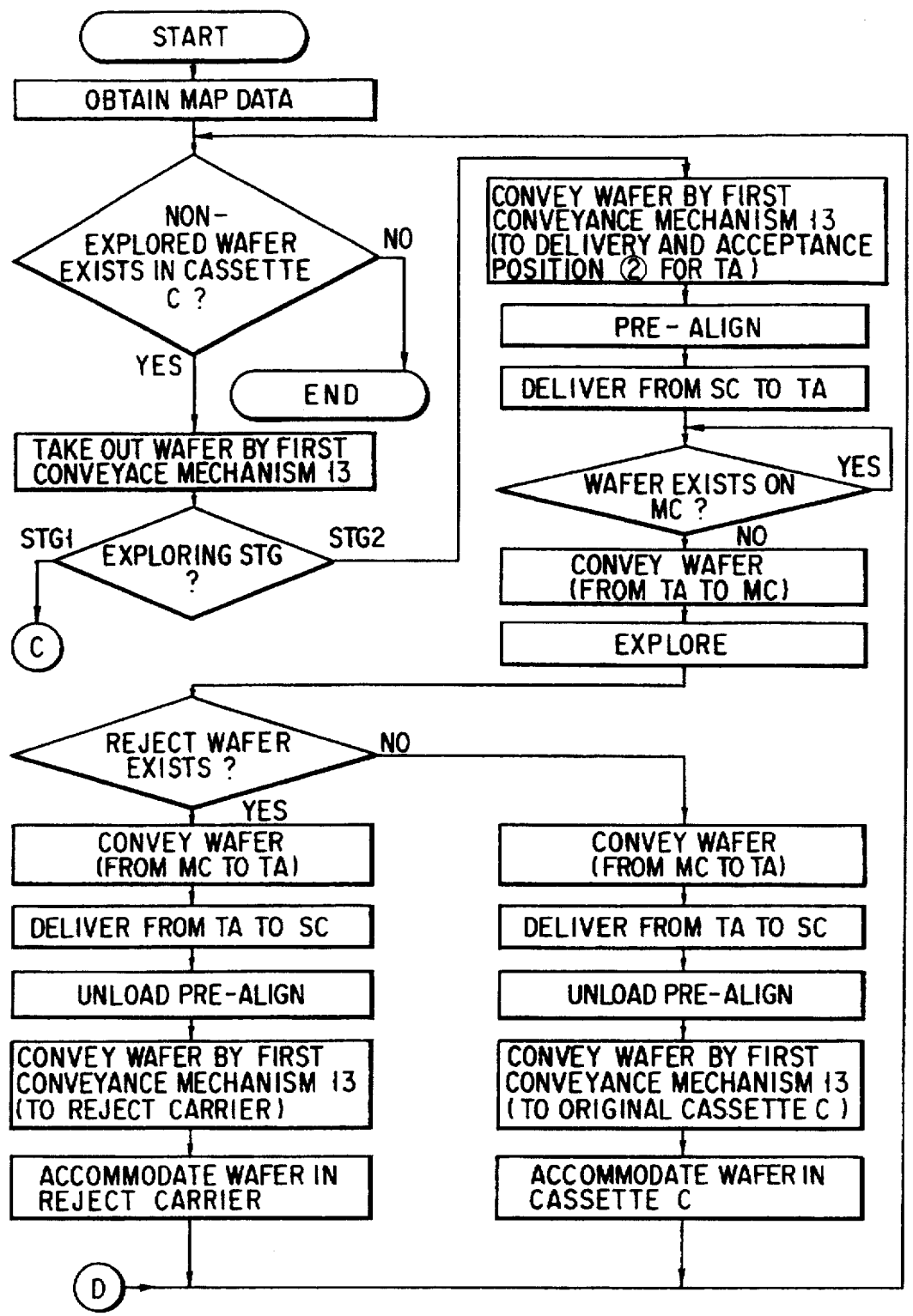
F I G. 12A

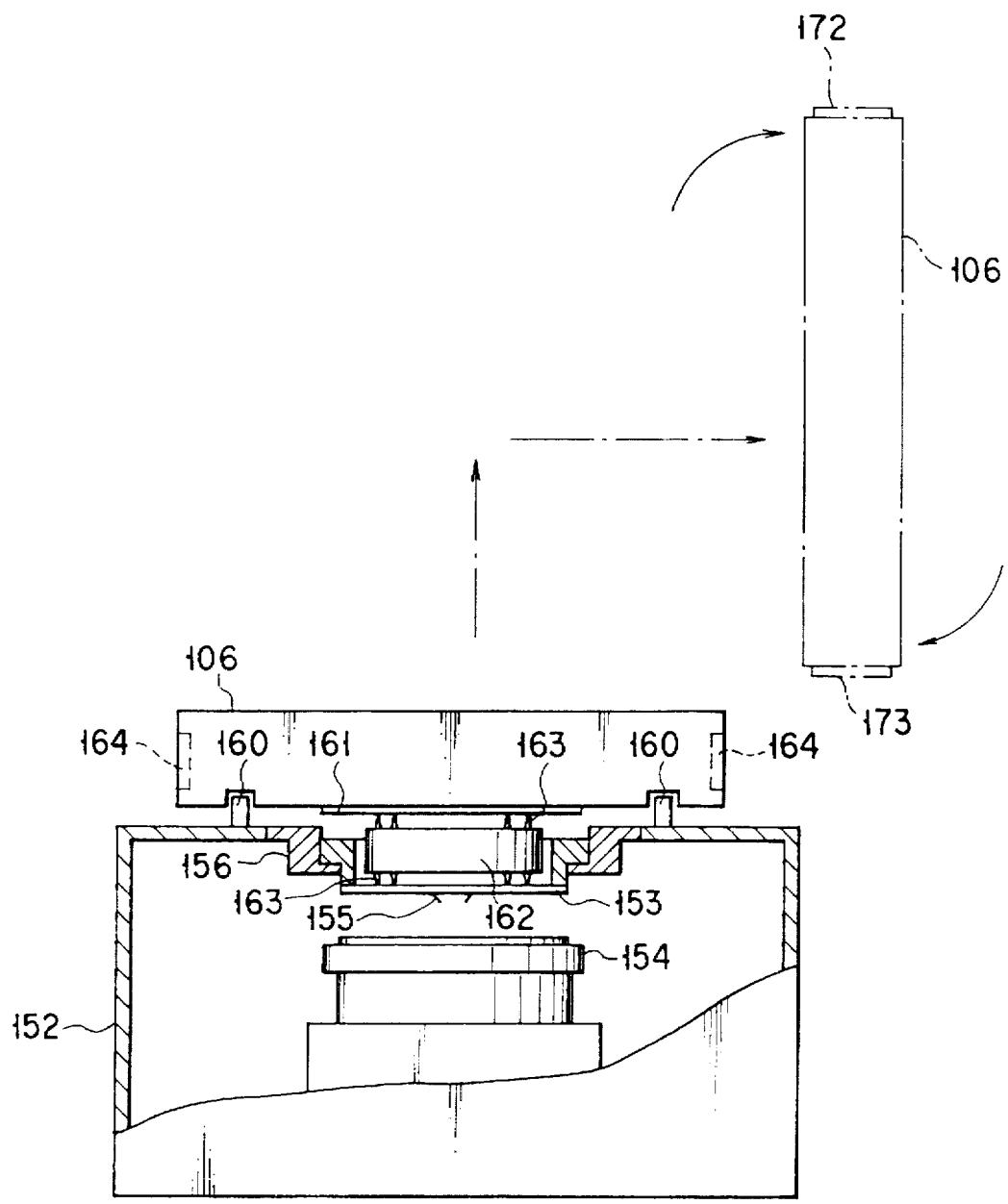
F I G. 17

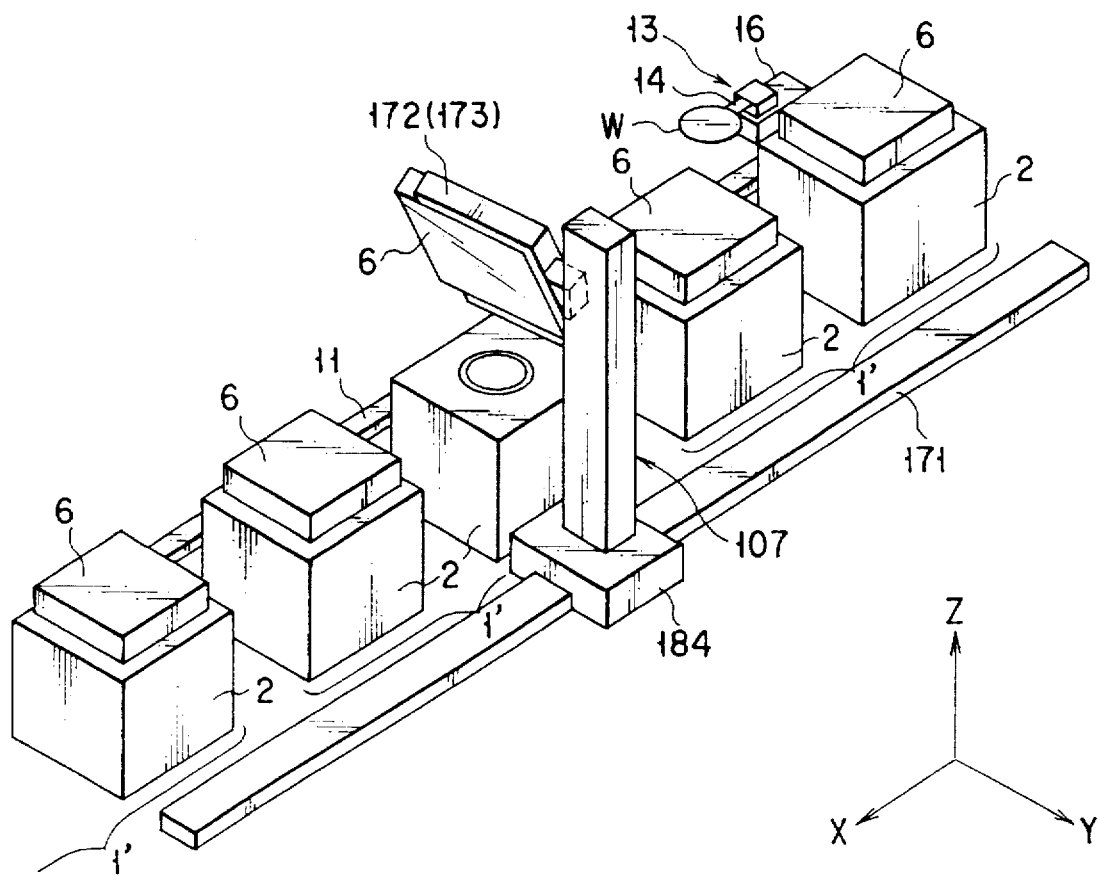
F I G. 18

PROBE SYSTEM

BACKGROUND OF THE INVENTION

1. Field of the Invention

The present invention relates to a probe system for exploring electrical characteristics of subjects of exploration, such as semiconductors.

2. Description of the Related Art

A probe apparatus for exploring electrical characteristics of subjects of exploration includes, for example, a conveyance portion for conveying a subject of exploration, for example, a semiconductor wafer; and an exploration portion for exploring the electrical characteristics of the semiconductor wafer received from the conveyance portion. The conveyance portion has a cassette retainer portion for retaining a cassette which includes a set of a plurality of semiconductor wafers; a conveyance mechanism which sequentially receives the semiconductor wafers from the cassette retainer portion so as to convey the semiconductor wafers; and a sub-chuck serving as a pre-alignment portion for setting the direction of an orientation flat portion of the semiconductor wafer into a predetermined direction during the process of conveyance of the semiconductor wafer by the conveyance mechanism. The exploration portion includes a main chuck which receives the pre-aligned semiconductor wafer from the conveyance mechanism of the conveyance portion and which places the semiconductor wafer thereon; an alignment mechanism for accurately positioning the semiconductor wafer on the main chuck;

and a probe card having a probe which electrically comes in contact with an electric pad of the aligned semiconductor wafer. Moreover, the exploration portion has a rotative test head. The foregoing test head rotates so as to be electrically connected to the probe card, and an exploration signal supplied from the tester is transmitted to the electric pad of the semiconductor wafer through the test head and the probe of the probe card so that the electrical characteristics of the IC chip formed on the semiconductor wafer are explored.

Recently, since reduction in the cost required to manufacture semiconductor products results in the cost of the electric products using the semiconductor products being reduced, value-added electric products have been developed. It leads to a fact that a variety of semiconductor products have been put on the market and the semiconductor products have been demanded considerably. Thus, the semiconductor products have been shifted from multikind and small quantity production to multikind and large quantity production. Therefore, probe apparatuses have been increased rapidly. However, since the probe apparatus is a self-completion type apparatus capable of completing the process from conveyance of semiconductor wafer to the exploration of the same, a necessity arises in that a conveyance portion and so forth accompanying the exploration portion are required to be increased as well as the exploration portion which is basically required to perform the exploration operation when the apparatus of the foregoing type is provided or increased. Therefore, whenever the number of the probe apparatus is increased, the space of the probe apparatus in the clean room and the cost of installation are enlarged excessively. The foregoing problem becomes further critical as the size of the subject of exploration, such as the semiconductor wafer, is enlarged.

In a case where the types of the subjects of exploration are different (in a case where the manufacturing lots are different), the probe apparatus of the foregoing type encounters a necessity of performing the exploration by another probe apparatus or changing the probe card. Thus, adoptability in performing the exploration and the efficiency of the exploration have been unsatisfactory.

SUMMARY OF THE INVENTION

An object of the present invention is to provide a probe system capable of reducing the space and the cost and improving efficiency in an exploration operation by improving in adoption characteristic in performing the exploration.

The object of the present invention can be achieved by the following probe system, that is, a probe system according to the present invention comprises a plurality of exploration portions disposed in a line, spaced apart from one another for predetermined distances and each having a test head, for establishing electrical connection between the test head and electrode of a subject of exploration so as to explore electrical characteristics of the subject of exploration; a conveyance passage running parallel to the line of the exploration portions; a retainer portion on which a plurality of the subjects of exploration are placed, which is facing to the conveyance passage and which is capable of elevating vertical with respect to the conveyance passage at a position above the conveyance passage; and delivery and acceptance means arranged capable of moving along the conveyance passage and arranged to deliver and accept the subjects of exploration between the retainer portion and each of the exploration portions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 is a perspective view showing a second delivery and acceptance mechanism of the probe system shown in FIG. 1;

FIG. 6 is a cross sectional view showing a state where a semiconductor wafer is delivered and received between a sub-chuck of the first delivery and acceptance mechanism shown in FIG. 4 and an arm of a second delivery and acceptance mechanism shown in FIG. 5;

FIG. 12A is a flow chart showing the first phase of the third operations of the probe system shown in FIG. 1;

FIG. 17 is a cross sectional view of the probe apparatus of the probe system shown in FIG. 14; and FIG. 18 is a perspective view showing a probe system according to a third embodiment of the present invention.

DETAILED DESCRIPTION OF THE PREFFERED EMBODIMENTS

Figure 1:
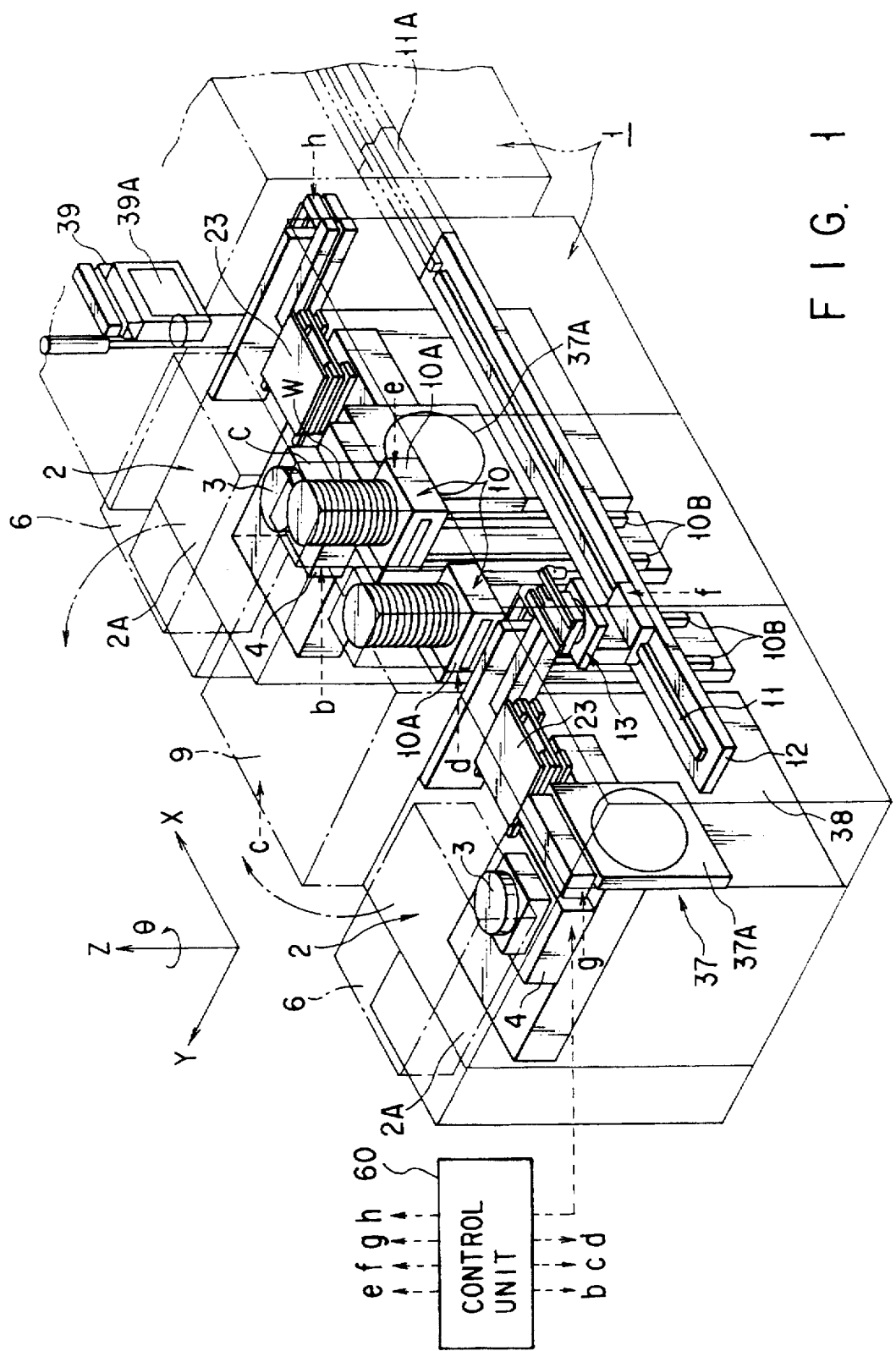
FIG. 1 is a perspective view showing a probe system according to a first embodiment of the present invention.

Referring to the drawings, preferred embodiments of the present invention will now be described.

Figure 2:
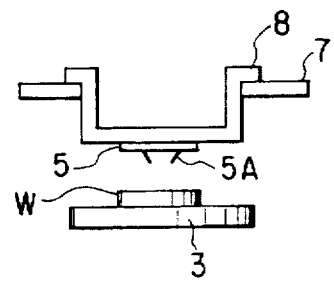
FIG. 2 is a schematic view showing the structure of an exploration position to be performed by an exploration portion of the probe system shown in FIG. 1.

FIGS. 1 to 13 show a first embodiment of the present invention. As shown in FIG. 1, a probe system 1 according to this embodiment has two exploration portions 2 for performing electrical exploration operations of subjects of exploration, for example, semiconductor wafers W. The exploration portions 2 are disposed apart from each other for a predetermined distance in a direction of X axis. Each of the exploration portions 2 has a main chuck 3 on which the semiconductor wafer W is placed and which vacuum-adsorbs the semiconductor wafer W, and a drive mechanism 4 for moving the main chuck 3 from a predetermined exploration position in the directions of the X axis, Y axis and Z axis and rotating the main chuck 3 around the Z axis (in a direction of θ). Note that the operation of the drive mechanism 4 is controlled by a control unit 60. The vacuum adsorption operation, to be performed by the main chuck 3, and suspension of the vacuum adsorption operation are controlled by the control unit 60. As shown in FIG. 2, the exploration portion 2 includes an exploration room 2A having a ceiling surface formed by a head plate 7. An insert ring 8 is attached to the head plate 7 at the exploration position. A probe card 5 is secured to the insert ring 8. The probe card 5 has a contractor, for example, a plurality of probes 5A, which electrically comes in contact with the semiconductor wafer W placed on the main chuck 3 moved to the exploration position by the drive mechanism 4.

Figure 3:
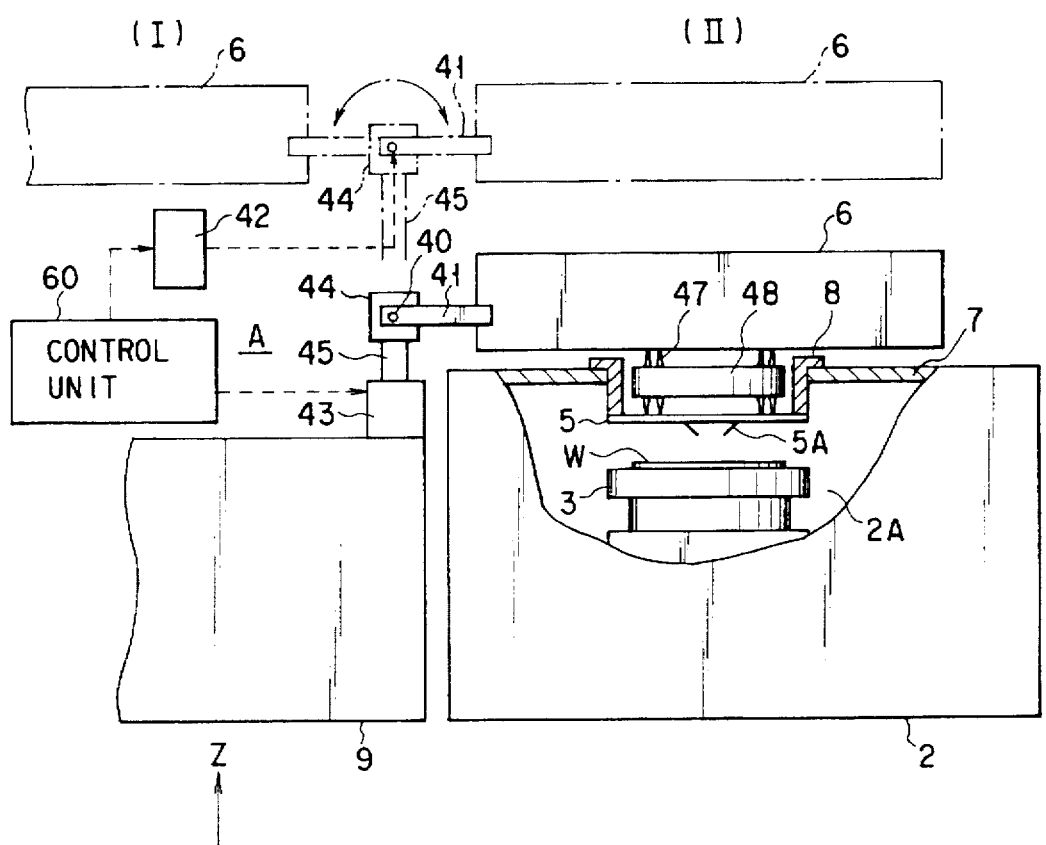
FIG. 3 is a structural view showing a swing drive mechanism of the probe system shown in FIG. 1.

Moreover, each of the exploration portions 2 has a test head 6 which is brought into electrically contact with the probes 5A of the probe card 5. The test heads 6 are individually swung (as indicated by an alternate long and short dash line arrow shown in FIG. 1) around a rotational shaft running parallel to the Y axis by a swing drive mechanism 9 disposed in a space formed between adjacent exploration portions 2. FIG. 3 shows the schematic structure of the swing drive mechanism 9. As shown in FIG. 3, the swing drive mechanism 9 has a swing drive system A disposed on the two sides in the direction of the X axis, the swing drive system A consisting of a rotation shaft 40 running parallel to the Y axis, a rotation mechanism 42 for rotating the rotation shaft 40, a swing arm 41 secured to the test head 6 and arranged to be swung when the rotation shaft 40 is rotated, a support portion 44 having the rotation shaft 40 and arranged to support the test head 6 through the swing arm 41, an elevation shaft 45 secured to the support portion 44 and an elevation mechanism 43 for elevating the elevation shaft 45. Note that the operations of the rotation mechanism 42 and the elevation mechanism 43 are controlled by the control unit 60. Therefore, according to the foregoing structure, when the rotation mechanism 42 rotates the rotation shaft 40 so as to swing the swing arm 41, the test head 6 in horizontal retracted state (I), for example, as indicated by the alternate long and short dash line shown in FIG. 3, is swung by an angular degree of 180 degrees so that the test head 6 is positioned right above the probe card 5 while being made to be level (in state (II) shown in FIG. 3). When the elevation shaft 45 is moved downwards by the elevation mechanism 43 in the foregoing state (II), the test head 6 is moved downwards while maintaining the horizontal state so as to be electrically connected to probes 5A of the probe card 5 through an electrode 47 of a contact ring 48.

As shown in FIG. 1, two retainer mechanisms 10 are adjacently disposed in front of the swing drive mechanism 9 in the direction of the Y axis, each of the retainer mechanisms 10 retaining cassette C, which is a container for storing, for example, twenty-five, semiconductor wafers W, to permit the cassette C to be elevated. Each of the retainer mechanisms 10 has a retaining portion 10A, on which the cassette C is placed, and an elevation drive mechanism (not shown) for moving upwards and downwards the retaining portion 10A along guide rails 10B, the elevation drive mechanism being controlled by the control unit 60. The guide rails 10B are disposed vertically and connected to, for example, the rear ends of the retaining portions 10A to guide the retaining portions 10A in the direction of the Z axis, the retaining portion 10A extending more forwards than the guide rails 10B. The elevation drive mechanism has, for example, an encoder which detects the speed of rotation of a motor (not shown). In response to a detection signal supplied from the encoder, the distance, for which the retaining portion 10A is moved, is controlled by the control unit 60.

Below the two retainer mechanisms 10, specifically, below the two retaining portions 10A, a conveyance rail 11 is disposed which extends along the front surfaces of the two exploration portions 2, the conveyance rail 11 being a conveyance passage. The conveyance rail 11 is disposed on an elongated frame 12 secured to, for example, the front surfaces of the exploration portions 2, the conveyance rail 11 extending from the left end of the left-hand exploration portion 2 to the right end of the right-hand exploration portion 2. The conveyance rail 11 is provided with a first delivery and acceptance mechanism 13 for delivering and accepting the semiconductor wafer W between the two retainer mechanisms 10 and the two exploration portions 2.

Figure 4:
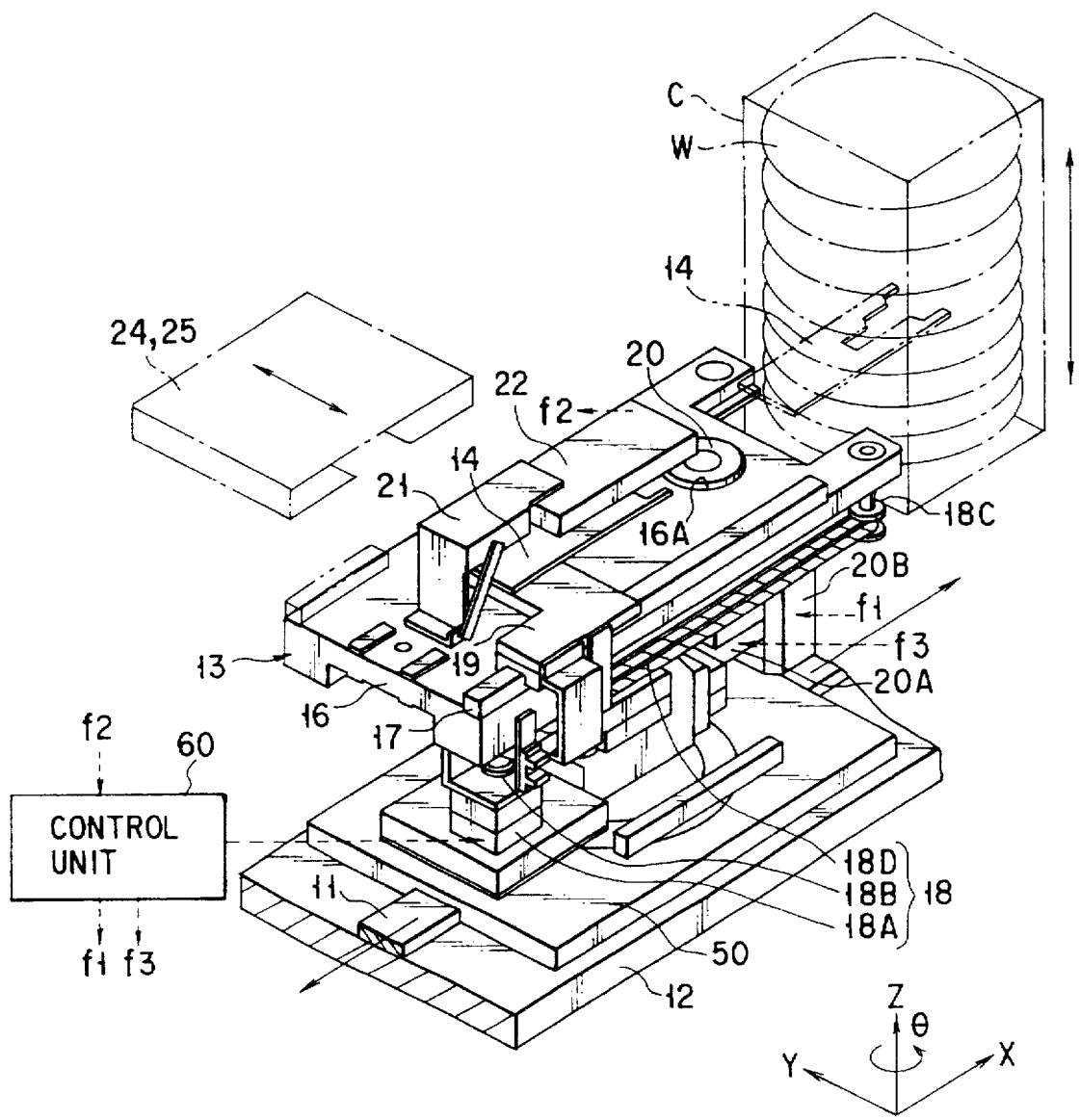
FIG. 4 is a perspective view showing a first delivery and acceptance mechanism of the probe system shown in FIG. 1.

As shown in FIG. 4, the first delivery and acceptance mechanism 13 has an arm 14 for sequentially eject the semiconductor wafers W in the cassette C on the retaining portion 10A moved downwards to a predetermined position before the semiconductor wafers W are explored or storing the explored semiconductor wafers W into the cassette C. The arm 14 is, through a connection member 19, movably supported by an elongated support member 16 extending in the direction of the X axis. That is, a rail 17 extending in the direction of the X axis is secured to the upper surface of the support member 16. The connection member 19 connected to the arm 14 is movably engaged to the rail 17. A drive mechanism 18 for reciprocating the connection member 19 along the rail 17 in the direction of the X axis is disposed on the lower surface of the support member 16. The drive mechanism 18 consists of a motor 18A, which is disposed on a frame 50 connected to the conveyance rail 11 and the rotation of which is controlled by the control unit 60, a drive pulley 18B connected to the motor 18A and supported on the lower end surface at the left end of the support member 16, a follower pulley 18C forming a pair with the drive pulley 18B and supported on the lower surface at the right end of the support member 16 and an endless belt 18D arranged between the two pulleys 18B and 18C. Note that the connection member 19 is connected to the endless belt 18D.

As a result of the foregoing structure, when the drive pulley 18B is rotated by the motor 18A and the endless belt 18D is, thus, rotated, the connection member 19 reciprocates along the rail 17 in the direction of the X axis. As a result, also the arm 14 reciprocates in the direction of the X axis. Thus, the arm 14 is enabled to take out the semiconductor wafer W from the cassette C or to introduce the semiconductor wafer W into the cassette C. The arm 14 vacuum-adsorbs the semiconductor wafer W so as to be able to hold the semiconductor wafer W in a fixed state. When the vacuum-adsorption state is suspended, the arm 14 is able to release the semiconductor wafer W. As a matter of course, the vacuum absorption operation and suspension of the foregoing operation are controlled by the control unit 60. The motor 18A is provided with, for example, an encoder which detects the revolving speed of the motor 18A. In accordance with the detection signal, the distance, for which the arm 14 is moved, is controlled by the control unit 60.

A sub-chuck 20 for directing the semiconductor wafer W ejected from the cassette C by the arm 14 into a predetermined direction to pre-align the semiconductor wafer W is disposed adjacent to the right end of the support member 16. The sub-chuck 20 is rotated forwards or reversely by a first motor 20A in a direction of θ. Moreover, the sub-chuck 20 is moved upwards or downwards by the second motor 20B so that the sub-chuck 20 is allowed to appear or disappear through a opening 16 formed on the support member 16. The sub-chuck 20 vacuum-adsorbs the semiconductor wafer W to be capable of fixedly holding the semiconductor wafer W on the top surface thereof. When the vacuum adsorption state is suspended, the sub-chuck 20 is able to release the semiconductor wafer W. The rotations of the first and second motors 20A and 20B are controlled by the control unit 60. Also the vacuum adsorption operation and the suspension of the same to be performed by the sub-chuck 20 are controlled by the control unit 60.

An optical sensor 22 for performing a pre-alignment operation supported by a support member 21 is disposed above the support member 16. The optical sensor 22 detects an orientation flat portion of the semiconductor wafer W on the sub-chuck 20 to supply a signal representing the detection to the control unit 60. In response to the detection signal supplied from the optical sensor 22, the control unit 60 rotates the first motor 20A to rotate the sub-chuck 20 so as to direct the orientation flat portion of the semiconductor wafer W into a predetermined direction.

As shown in FIG. 1, the conveyance rail 11 and the first delivery and acceptance mechanism 13 are covered with a cover 38 so as to be shielded from the outside. As a cover 38 of the foregoing type, a transparent plate made of transparent acrylic resin is employed. As a result, the state where the first delivery and acceptance mechanism 13 delivers and accepts the semiconductor wafer W between the retainer mechanisms 10 and the exploration portions 2 can be monitored from outside.

The semiconductor wafer W, pre-aligned by the sub-chuck 20, is delivered from the first delivery and acceptance mechanism 13 to a second delivery and acceptance mechanism 23. As shown in FIG. 1, the second delivery and acceptance mechanism 23 for delivering and accepting the semiconductor wafer W to and from the first delivery and acceptance mechanism 13 is disposed in a right space of the exploration room 2A in such a manner that the second delivery and acceptance mechanism 23 is allowed to reciprocate in the foregoing space in the direction of the Y axis. As shown in FIG. 5, the second delivery and acceptance mechanism 23 has a rectangular upper arm 24 for receiving the pre-aligned semiconductor wafer W from the sub-chuck 20 of the first delivery and acceptance mechanism 13 to deliver the same onto the main chuck 3; and a rectangular lower arm 25 disposed below the upper arm 24 and arranged to receive the exploded semiconductor wafer W from the main chuck 3 so as to deliver the semiconductor wafer W to the sub-chuck 20 of the first delivery and acceptance mechanism 13. That is, the upper arm 24 is formed into a loader arm for delivering the semiconductor wafer W pre-aligned by the sub-chuck 20 to the main chuck 3. On the other hand, the lower arm 25 is formed into an unloader arm for delivering the explored semiconductor wafer W from the main chuck 3 to the sub-chuck 20. As a matter of course, if necessary, the upper arm 24 may be operated as the unloader arm and the lower arm 25 may be operated as the loader arm. Note that the arms 24 and 25 are made of, for example, ceramics.

As shown in FIG. 5, the arms 24 and 25 are disposed on a support member 26 secured to the right side surface of the exploration room 2A and extending in the direction of the Y axis so as to be allowed to reciprocate in the direction of the Y axis. That is, the second delivery and acceptance mechanism 23 has support rods 27 and 28 which are arranged to support the arms 24 and 25 at one edges thereof and each of which is formed into an L-like-shape; guide rails 29 engaged to the support rods 27 and 28 and extending in the direction of the Y axis; an elongated first frame 33 for supporting the guide rails 29; an elongated second frame 34 for upwards supporting the first frame 33; Y-directional drive mechanisms 31 (FIG. 5 shows either of the connection members 30 and the Y-directional drive mechanism 31) disposed on the second frame 34 and connected to the support rods 27 and 28 through the connection members 30; and a Z-directional drive mechanism 32 connected to the second frame 34 and the support member 26 and arranged to vertically move the second frame 34 so as to integrally move the upper mechanism including the arms 24 and 25 and the Y-directional drive mechanisms 31 in the direction of the Z axis.

The Y-directional drive mechanism 31 consists of a motor 31A which is disposed below the second frame 34, which is the lower frame, and the rotation of which is controlled by the control unit 60; a drive pulley 31B connected to the motor 31A and secured to the top surface of the left end of the second frame 34; a follower pulley 31C forming a pair with the drive pulley 31B and secured to the top surface of the right end of the second frame 34; and an endless belt 31D arranged between the two pulleys 31B and 31C. A connection member 30 (30) connected to the support rod 27 (28) of the arm 24 (25) is connected to the endless belt 31D. Therefore, when the Y-directional drive mechanism 31 is operated, the arms 24 and 25 can be moved in the direction of the Y axis along the guide rails 29. Note that the motor 31A is provided with, for example, an encoder which detects the revolving speed of the motor 31A. In accordance with the detection signal supplied from the encoder, the distances, for which the arms 24 and 25 are moved, are controlled by the control unit 60. On the other hand, the Z-directional drive mechanism 32 comprises, for example, an air cylinder including a cylinder rod, the upper end of which is connected to a substantially center position of the lower surface of the second frame 34.

The first frame 33, which is the upper frame, has, for example, on the side surface thereof, a proximity switch 35 for detecting a home position (a retraction position) for each of the arms 24 and 25 in the direction of the Z axis; and an optical sensor 36 for detecting a home position (a retraction position) of each of the arms 24 and 25 in the direction of the Y axis. The optical sensor 36 has a light emitting portion and a light receiving portion. When light emitted by the light emitting portion of the optical sensor 36 toward the light receiving portion of the same is shielded by a light-shield member 39 provided for the connection member 30, the optical sensor 36 detects the home position of each of the arms 24 and 25 in the direction of the Y axis. Detection signals supplied from the optical sensor 36 and the proximity switch 35 are supplied to the control unit 60. In accordance with the detection signals supplied from the optical sensor 36 and the proximity switch 35, the control unit 60 recognizes the home position of each of the arms 24 and 25 so as to control the following operation of each of the arms 24 and 25.

As shown in FIG. 6, the arm 24 (25) has corresponding projection portions 24A (25A) projecting over the two side portions of the lower surface of the arm 24 (25). Thus, the arm 24 (25) is totally formed into a squarish C-shape. The arm 24 (25) is operated by the Y-directional drive mechanism 31 and the Z-directional drive mechanism 32 so as to make an access to the semiconductor wafer W on the sub-chuck 20 or the main chuck 3. Thus, projection portions 24A (25A) of the arm 24 (25) receive the semiconductor wafer W from the top surface of the sub-chuck 20 or the main chuck 3 or deliver the semiconductor wafer W held by the projection portions 24A (25A) to the upper surface of the main chuck 3 or the sub-chuck 20. The projection portions 24A (25A) have vacuum-adsorbing openings (not shown) so as to adsorb and fix the semiconductor wafer W to the projection portions 24A (25A) through the foregoing openings when the arm 24 (25) receive the semiconductor wafer W.

Therefore, when the upper arm 24 receives the semiconductor wafer W from the sub-chuck 20, the upper arm 24 makes an access to the sub-chuck 20 so that the semiconductor wafer W is received by the projection portions 24A of the upper arm 24. At this time, the vacuum adsorption performed by the sub-chuck 20 is suspended. When the semiconductor wafer W is delivered from the lower arm 25 to the sub-chuck 20, the sub-chuck 20 is moved upwards when the lower arm 25 has been moved to a position right above the sub-chuck 20 so that the semiconductor wafer W is allowed to float in the lower arm 25 so as to be separated from the projection portions 25A. In the state where the semiconductor wafer W is allowed to float in the lower arm 25, the lower arm 25 is subsequently moved from the position adjacent to the sub-chuck 20 toward the second delivery and acceptance mechanism 23 in the direction of the Y axis. As a result, the semiconductor wafer W is delivered to the sub-chuck 20.

Figures 7A, 7B:
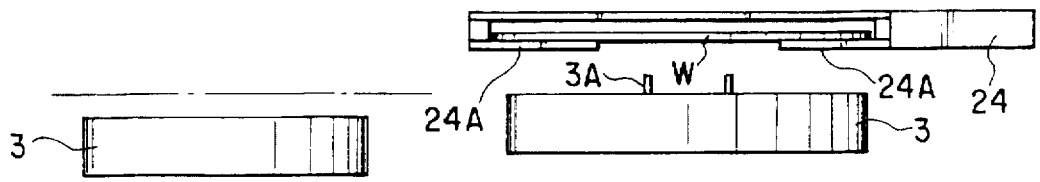
FIG. 7A is a front view showing an initial position of a main chuck of the probe system shown in FIG. 1.
FIG. 7B is a front view showing a state where a semiconductor wafer is delivered and received between an upper arm of the second delivery and acceptance mechanism and the main chuck shown in FIG. 5.

As shown in FIG. 7B, the main chuck 3 has, in the central portion thereof, for example, three elevation pins 3A (FIG. 7B illustrates only two elevation pins 3A). When the semiconductor wafer W is received from the upper arm 24, the elevation pins 3A project from the inner portion of the main chuck 3. After the semiconductor wafer W has been received from the upper arm 24, the elevation pins 3A are retracted into the main chuck 3. After the main chuck 3 has received the semiconductor wafer W from the upper arm 24 and the elevation pins 3A have been retracted into the main chuck 3, the main chuck 3 vacuum-adsorbs the semiconductor wafer W.

Figure 8:
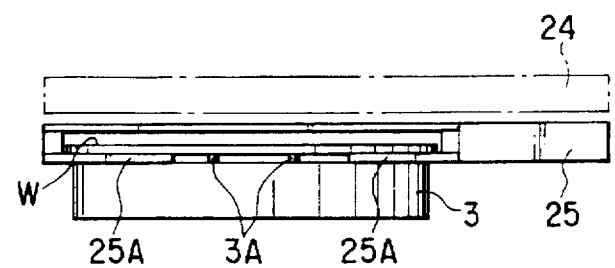
FIG. 8 is a front view showing a state where a semiconductor wafer is delivered and received between the main chuck and a lower arm of the second delivery and acceptance mechanism.

Therefore, when the main chuck 3 receives the semiconductor wafer W from the upper arm 24, the main chuck 3 is, by the drive mechanism 4, initially moved upwards from an initial position shown in FIG. 7A to a position shown in FIG. 7B. When the upper arm 24 has been moved to a position right above the main chuck 3, the elevation pins 3A are allowed to project and the main chuck 3 is moved further upwards from the position shown in FIG. 7B. Then, the semiconductor wafer W is allowed to float in the upper arm 24 so as to be separated from the projection portions 24A by the elevation pins 3A. In the state where the semiconductor wafer W is allowed to float in the upper arm 24, the upper arm 24 is subsequently moved from the position adjacent to the main chuck 3 toward the first delivery and acceptance mechanism 13 in the direction of the Y axis. As a result, the semiconductor wafer W is delivered to the main chuck 3. On the other hand, when the semiconductor wafer W is allowed to float from the main chuck 3 by the elevation pins 3A, the lower arm 25, as shown in FIG. 8, makes an access to the main chuck 3 to receive the semiconductor wafers W by the projection portions 25A of the lower arm 25. At this time, the vacuum adsorption performed by the main chuck 3 is suspended and the elevation pins 3A are retracted into the main chuck 3.

As shown in FIG. 1, the exploration portion 2 has a card-conveyance mechanism 37 for semi-automatically changing the probe card 5. The card-conveyance mechanism 37 conveys the probe card 5 while placing the probe card 5 on a tray 37A thereof. The tray 37A is, by an operator, rotated from an illustrated accommodation position on the front surface of the exploration room 2A, at which the tray 37A is folded, to a horizontal setting position at which the probe card 5 can be set horizontally. When the probe card 5 has been set on the tray 37A at the foregoing setting position, the tray 37A is, by the card-conveyance mechanism 37, moved from the setting position to a delivery and acceptance position (a position right below the insert ring 8 in the exploration room 2A) at which the probe card 5 is delivered or received to and from the insert ring 8 so as to automatically convey the probe card 5. The insert ring 8 has an attaching/detaching mechanism (not shown) for attaching and detaching the probe card 5. When the tray 37A has been moved upwards at the position right below the insert ring 8, the probe card 5 is automatically attached to the insert ring 8 by the attaching/detaching mechanism or the probe card 5 attached to the insert ring 8 is automatically removed.

The exploration room 2A contains a pair of CCD cameras (not shown) for performing an alignment operation which are disposed apart from each other in the vertical direction.

To accurately align the semiconductor wafer W to a direction required for performing the exploration, the CCD cameras photograph the probes 5A and the semiconductor wafer W with a high magnification or a low magnification. Individually from the foregoing CCD cameras, another CCD camera for monitoring the internal portion of the exploration room 2A is provided. An image of the inner portion of the exploration room 2A photographed by the CCD camera is displayed on two frames 39A of a display unit 39.

Figure 9:
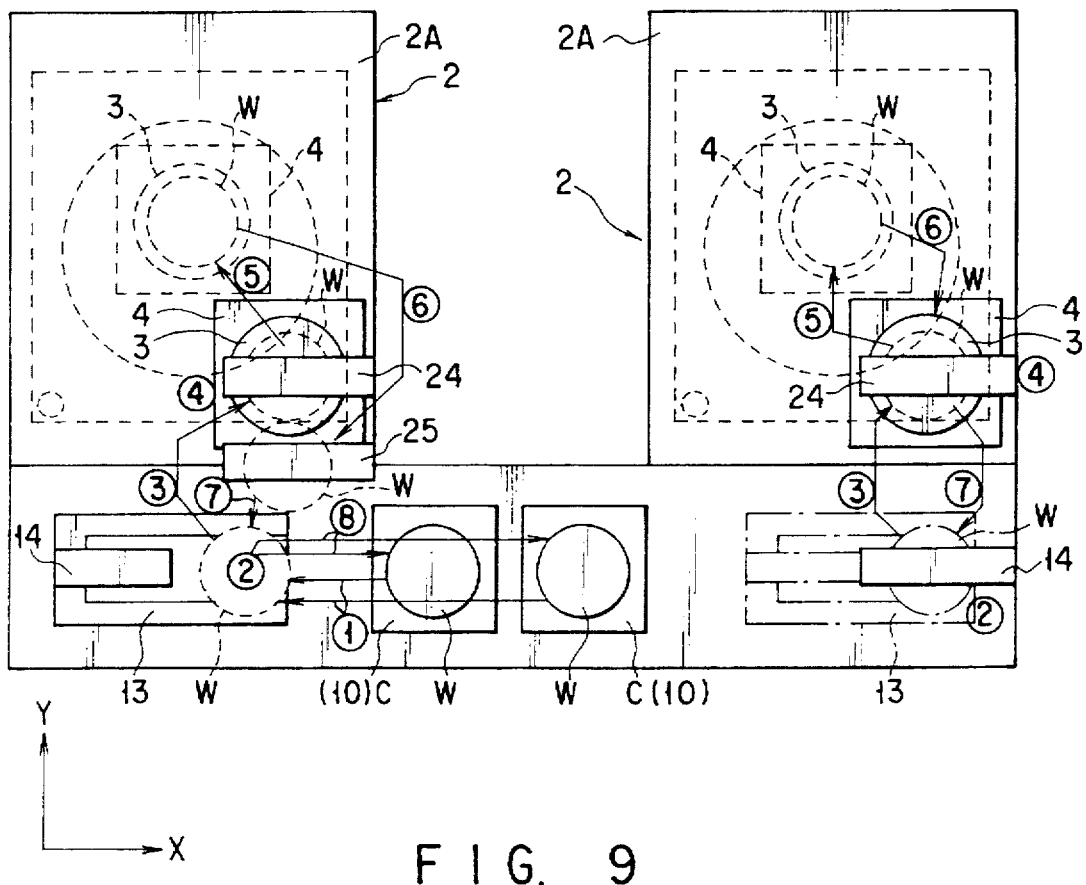
FIG. 9 is a diagram showing flow of the semiconductor wafer in the probe system shown in FIG. 1.

An operation of exploring the semiconductor wafer W by using the probe system 1 having the foregoing structure will now be described with reference to FIG. 9.

Initially, in a state where cassette C accommodating a plurality of semiconductor wafers W is placed on each of the retaining portions 10A of the two retainer mechanisms 10, a predetermined switch on a control panel displayed on the two frames of the display unit 39 is operated so that the probe system 1 is turned on. When the probe system 1 has been turned on, the first delivery and acceptance mechanism 13 is moved along the conveyance rail 11 in the direction of the X axis toward the retainer mechanism 10. Simultaneously, for example, the left-hand retaining portion 10A is moved downwards and stops at a predetermined position. Then, the first delivery and acceptance mechanism 13 is stopped at the position at which the semiconductor wafer W is ejected. Simultaneously, the arm 14 is moved forwards in the direction of the X axis (toward the right-hand position of the drawing) to be introduced into a predetermined position in the cassette C on the left retaining portion 10A so as to make an access to the semiconductor wafer W. The arm 14, which has made an access to the semiconductor wafer W, vacuum-adsorbs the semiconductor wafer W, and then moves rearwards in the direction of the X axis so as to take the semiconductor wafer W from the inner portion of the cassette C (state ① shown in FIG. 9). During this, the first delivery and acceptance mechanism 13 is, together with the arm 14, moved rearwards in the direction of the X axis, and then stopped at a delivery and acceptance position (position ② shown in FIG. 9) to and from the second delivery and acceptance mechanism 23. During the movement of the first delivery and acceptance mechanism 13 to the delivery and acceptance position ②, the arm 14 is moved rearwards over the position, at which the sub-chuck 20 projects and retracts, in the direction of the X axis. Thus, the semiconductor wafer W is positioned on the sub-chuck 20. In the foregoing state, the sub-chuck 20 is moved upwards due to the rotations of the second motor 20B so as to be brought into contact with the reverse surface of the semiconductor wafer W held by the arm 14 and vacuum-adsorbs the semiconductor wafer W. At this time, the vacuum adsorption performed by the arm 14 is suspended. Then, the first motor 20A is rotated so that the sub-chuck 20 is rotated in the direction θ. During the rotation of the sub-chuck 20, the optical sensor 22 for performing the pre-alignment operation detects the orientation flat portion of the semiconductor wafer W. In accordance with the detection signal supplied from the optical sensor 22, the control unit 60 controls the rotation of the first motor 20A, that is, the amount of rotation of the sub-chuck 20 so as to pre-align the semiconductor wafer W into a predetermined direction. As described above, the foregoing pre-alignment is performed during the movement of the first delivery and acceptance mechanism 13 to the delivery and acceptance position ②.

After the pre-alignment of the semiconductor wafer W has been completed and the first delivery and acceptance mechanism 13 has been stopped at the delivery and acceptance position ②, the upper arm 24 of the second delivery and acceptance mechanism 23 is, by the Y-directional drive mechanism 31, moved in the direction of the Y axis to the delivery and acceptance position ② or has been brought to a standby state at a position near the delivery and acceptance position ②. At the delivery and acceptance position ②, the upper arm 24 makes an access to the sub-chuck 20 in the direction of the Y axis so as to receive the semiconductor wafer W by the projection portions 24A thereof. At this time, the vacuum adsorption performed by the sub-chuck 20 is suspended. Then, the upper arm 24, which has received the semiconductor wafer W, is moved in the direction of the Y axis onto the main chuck 3 which has been brought to the standby state at a delivery and acceptance position ④ in the exploration room 2A (state ③ shown in FIG. 9). At the foregoing delivery and acceptance position ④, the upper arm 24 delivers the semiconductor wafer W to the upper surface of the main chuck 3, as described above.

The main chuck 3, which has received the semiconductor wafer W, is moved to an exploration position by the drive mechanism 4 (state ⑤ shown in FIG. 9) to be effected by an alignment mechanism (not shown) so as to be moved in the directions of the X axis, Y axis and θ so that the main chuck 3 aligns the semiconductor wafer W. After the semiconductor wafer W has been aligned, the main chuck 3 is moved upwards so that the electrodes of the semiconductor wafer W are brought into electrically contact with the probes 5A. As a result, the electrical characteristics of the semiconductor wafer W are explored.

On the other hand, the first delivery and acceptance mechanism 13, which has delivered the received semiconductor wafer W to the second delivery and acceptance mechanism 23, ejects the semiconductor wafer W to be explored subsequently from the cassette C placed on either of the right retaining portion 10A or the left retaining portion 10A as described above during the exploration of the electrical characteristics of the semiconductor wafer W in the left-hand exploration portion 2. Then, the first delivery and acceptance mechanism 13 conveys the non-explored semiconductor wafer W to the right-hand exploration portion 2. In the right-hand exploration portion 2, the semiconductor wafer W is, while a time delay is provided, delivered from the first delivery and acceptance mechanism 13 to the main chuck 3 by the second delivery and acceptance mechanism 23 similar to the operation performed by the left-hand exploration portion 2 (also the right-hand exploration portion 2 is given process numbers ②, ③ and so forth similarly to the left-hand exploration portion 2) so that the semiconductor wafer W is explored. The foregoing sequential operations of the first delivery and acceptance mechanism 13 are monitored through the transparent cover 38.

The time in which each of the exploration portions 2 performs the exploration is considerably longer than the time in which the semiconductor wafer W is delivered and received. Therefore, the first delivery and acceptance mechanism 13 and the second delivery and acceptance mechanism 23 perform the following operation to prepare for the following exploration. That is, the first delivery and acceptance mechanism 13, as described above, delivers the semiconductor wafer W to the upper arm 24 of the second delivery and acceptance mechanism 23 in the right-hand exploration portion 2, and then takes out a non-explored semiconductor wafer W from the cassette C on either of the right-hand retaining portion 10A or the left-hand retaining portion 10A. Then, the first delivery and acceptance mechanism 13 delivers the semiconductor wafer W to the upper arm 24 of the second delivery and acceptance mechanism 23 of the left-hand exploration portion 2 which has delivered the semiconductor wafer W to the main chuck 3. In the foregoing case, the upper arm 24 is, by the Y-directional drive mechanism 31, moved in the direction of the Y axis to the delivery and acceptance position ② to receive the semiconductor wafer W from the first delivery and acceptance mechanism 13. Then, the first delivery and acceptance mechanism 13 subsequently takes out a non-explored semiconductor wafer W from the cassette C on either of the right-hand retaining portion 10A or the left-hand retaining portion 10A so as to deliver the semiconductor wafer W to the upper arm 24 of the second delivery and acceptance mechanism 23 of the right-hand exploration portion 2 which has delivered the semiconductor wafer W to the main chuck 3. Also in the foregoing case, the upper arm 24 is, by the Y-directional drive mechanism 31, moved to the delivery and acceptance position ② so as to receive the semiconductor wafer W from the first delivery and acceptance mechanism 13. As described above, the upper arms 24 of the exploration portions 2, which have received the semiconductor wafers W from the first delivery and acceptance mechanism 13, are again moved in the direction of the Y axis and then brought to the standby state at the delivery and acceptance position ④ until the exploration of the semiconductor wafer W delivered to the main chuck 3 is completed.

After the semiconductor wafer W has been explored in the left-hand exploration portion 2, the main chuck 3 is moved to the delivery and acceptance position ④ and suspends the vacuum adsorption state. Thus, the main chuck 3 moves upwards the explored semiconductor wafer W by the elevation pins 3A thereof. Immediately after this, the lower arm 25 of the second delivery and acceptance mechanism 23 is moved to the delivery and acceptance position ④ so that the semiconductor wafer W is delivered from the main chuck 3 to the lower arm 25 (the foregoing operation has been described). Subsequently, the lower arm 25 is moved in the direction of the Y axis toward the delivery and acceptance position ② (state ⑥ shown in FIG. 9). At the delivery and acceptance position ②, the lower arm 25 delivers the explored semiconductor wafer W to the upper surface of the sub-chuck 20 of the first delivery and acceptance mechanism 13 (state ⑦ shown in FIG. 9). Simultaneously, the upper arm 24 of the second delivery and acceptance mechanism 23 in the standby state at the delivery and acceptance position ④ delivers a non-explored semiconductor wafer W in a standby state to the main chuck 3. Then, the main chuck 3 is moved to the exploration position to explore the non-explored semiconductor wafer W.

After the first delivery and acceptance mechanism 13 has received the explored semiconductor wafer W by the sub-chuck 20, the first delivery and acceptance mechanism 13 moves the arm 14 to a position below the semiconductor wafer W on the sub-chuck 20. In the foregoing state, the sub-chuck 20 is moved downwards and the vacuum adsorption state realized by the sub-chuck 20 is suspended so that the semiconductor wafer W is, by vacuum adsorption, delivered to the arm 14. Then, the first delivery and acceptance mechanism 13 is moved in the direction of the X axis, and then the semiconductor wafer W is returned to the original position in the cassette C by the arm 14 (state ⑧ shown in FIG. 9). Then, the first delivery and acceptance mechanism 13 is moved to the right-hand exploration portion 2, and then receives explored semiconductor wafer W from the right-hand exploration portion 2 similarly to the left-hand exploration portion 2 to return the semiconductor wafer W to the original position in the cassette C. During this, in the right-hand exploration portion 2, the upper arm 24 of the second delivery and acceptance mechanism 23, which has been brought to the standby state at the delivery and acceptance position ④, delivers the non-explored semiconductor wafer W, which has been brought to the standby state, to the main chuck 3. Then, the main chuck 3 is moved to the exploration position to explore the non-explored semiconductor wafer W. The foregoing sequential operations are performed until all of the semiconductor wafers W are explored.

Figure 10:
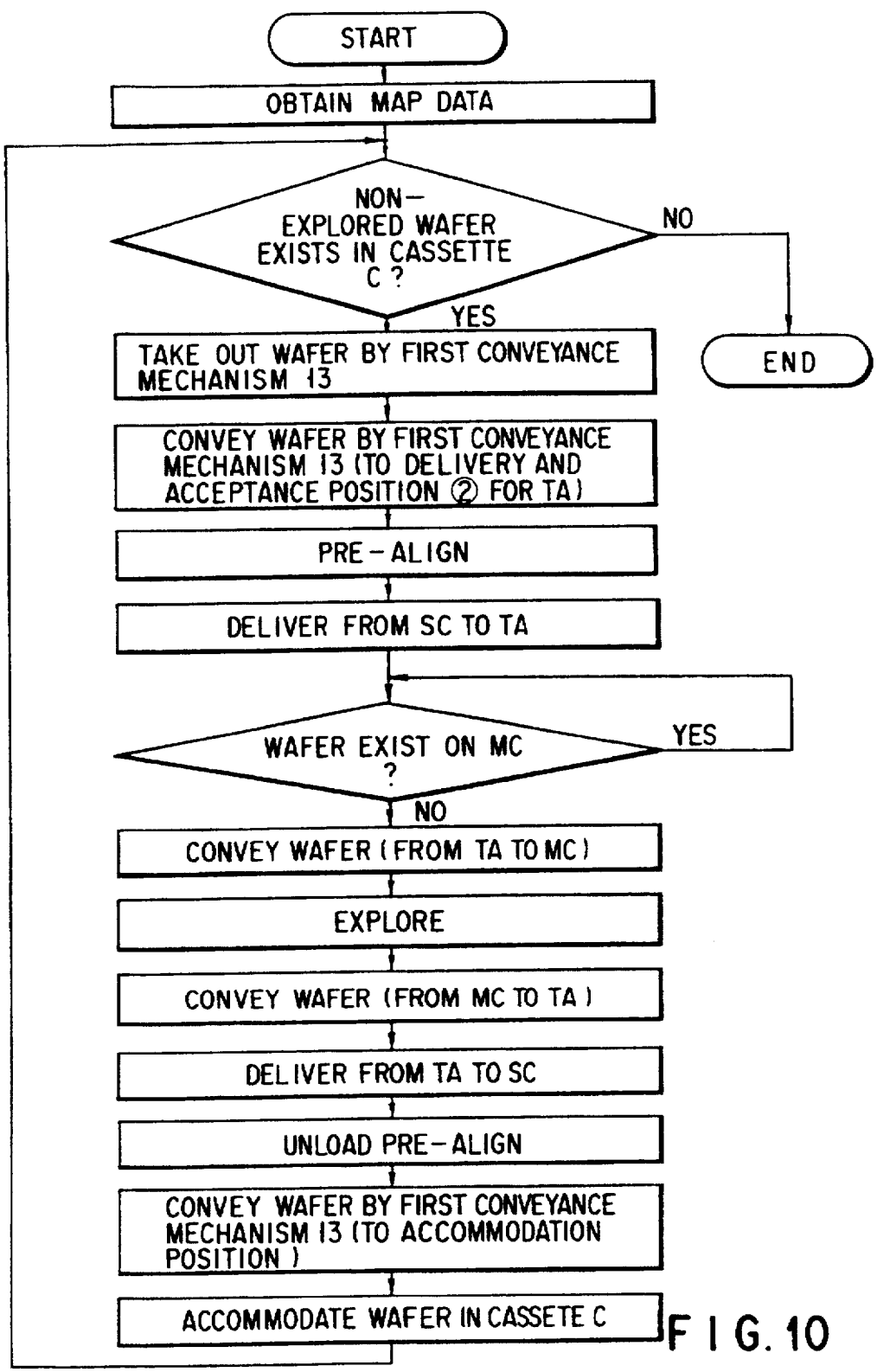
FIG. 10 is a flow chart showing flow of the first operations which can be embodied by the probe system shown in FIG. 1.

Among the foregoing sequential operations, a flow chart of the basic operations ① to ⑧ is shown in FIG. 10. Referring to FIG. 10, symbols TA represent the second delivery and acceptance mechanism 23, MC represent the main chuck 3 and SC represent the sub-chuck 20.

Figure 11A:
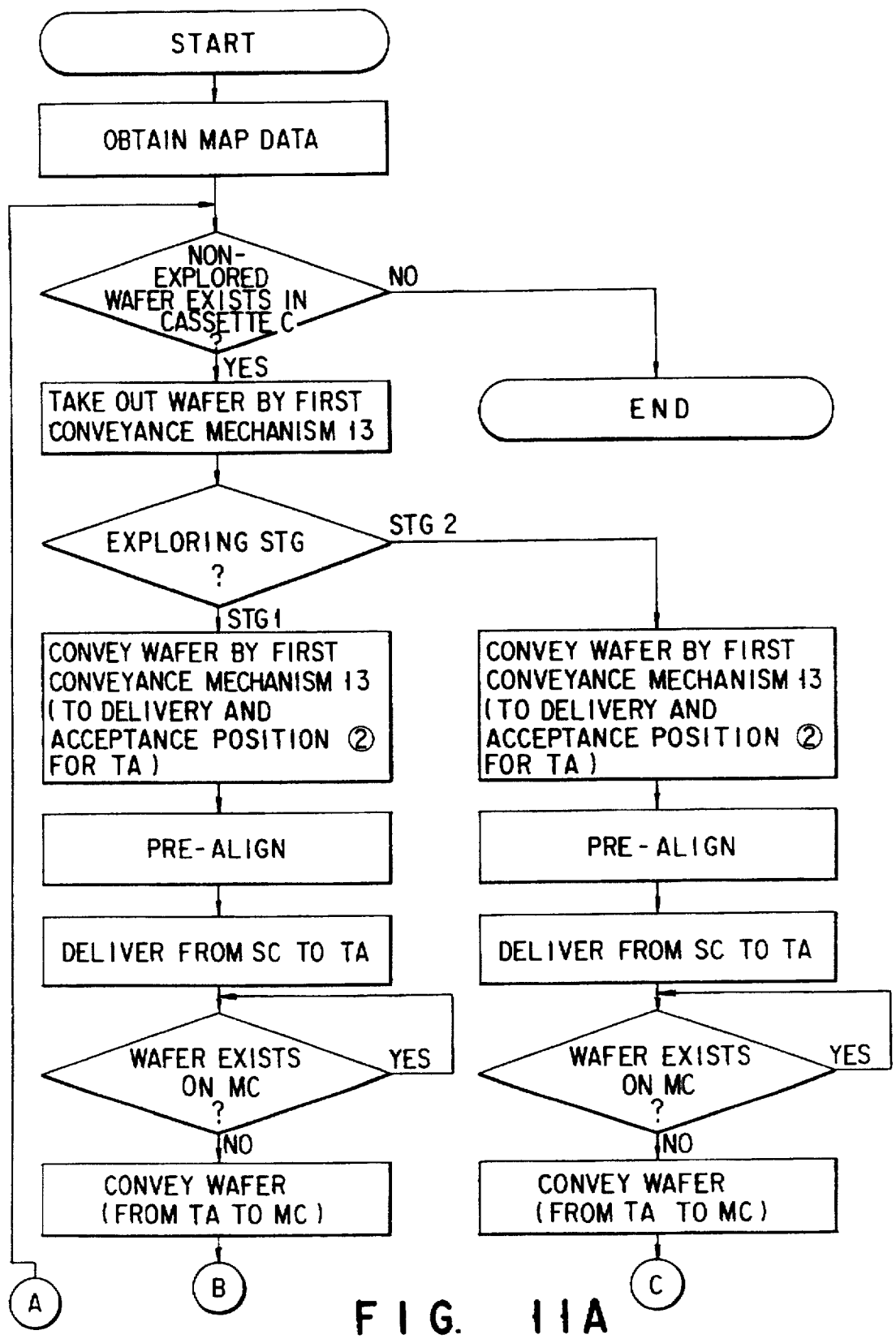
FIG. 11A is a flow chart showing the first phase of the second operations of the probe system shown in FIG. 1.
Figure 11B:
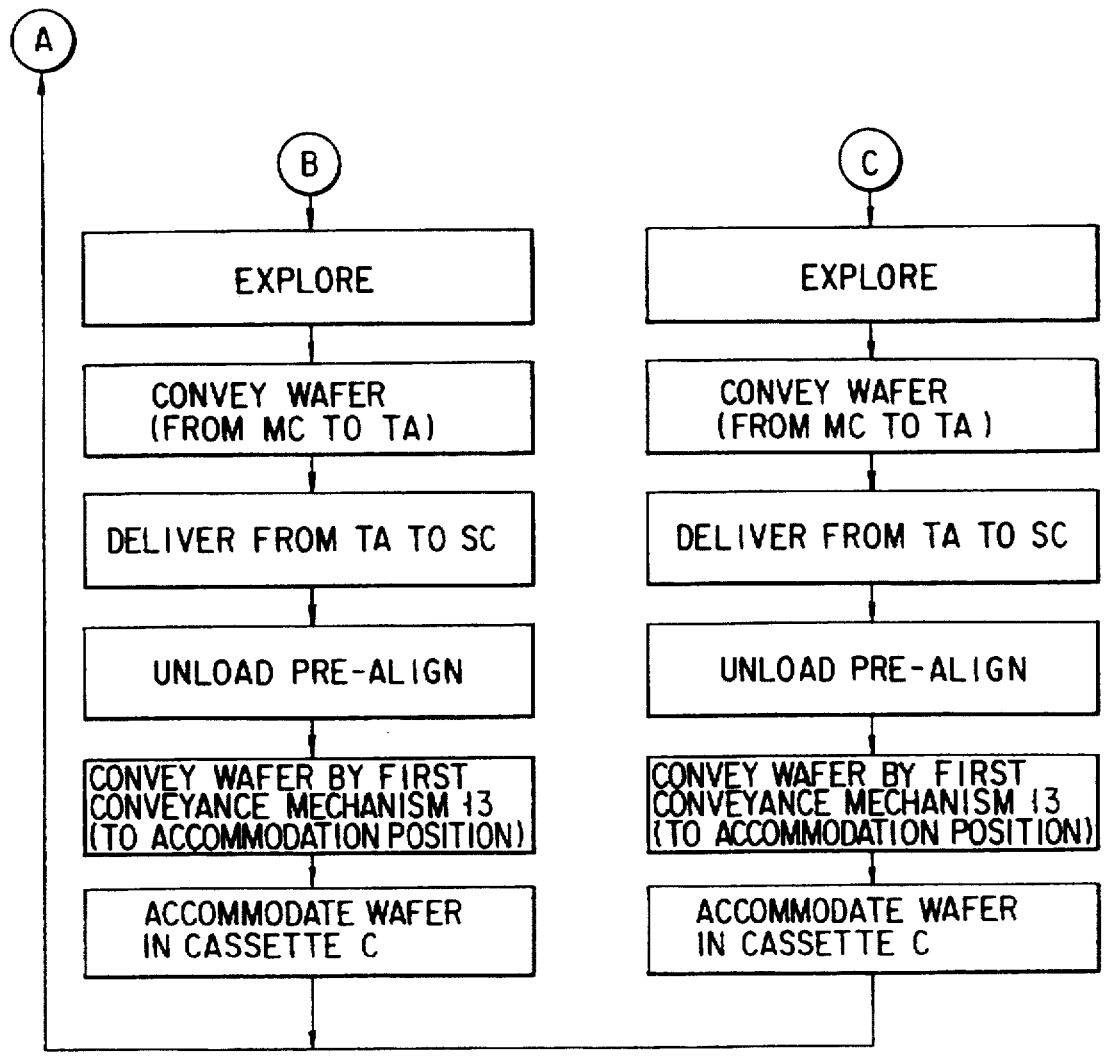
FIG. 11B is a flow chart showing the remaining phase of the second operations of the probe system shown in FIG. 1.
Figure 12B:
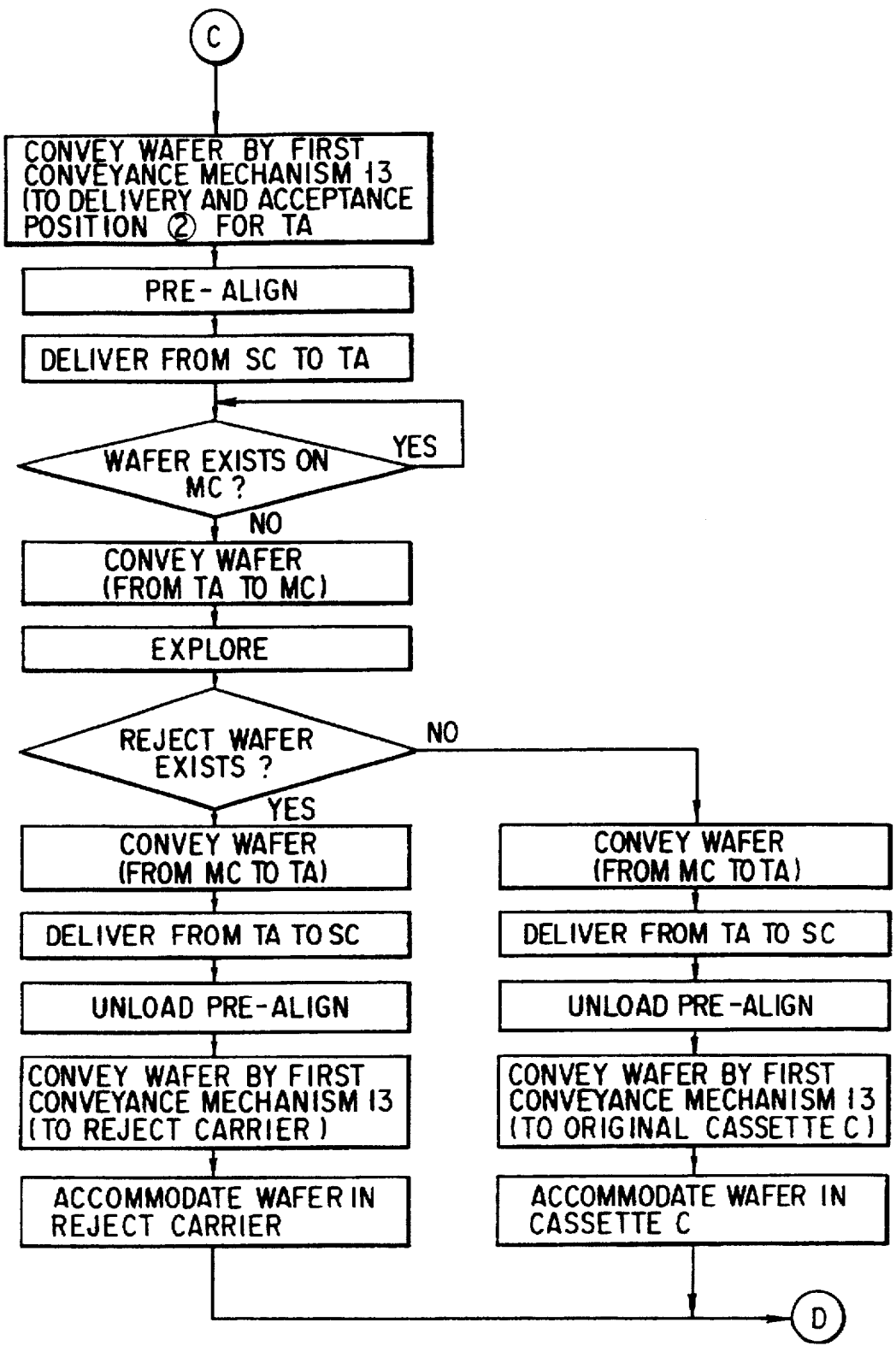
FIG. 12B is a flow chart showing the remaining phase of the third operations of the probe system shown in FIG. 1.

In the probe system 1 having the foregoing structure, in the case where the two exploration portions 2 explore semiconductor wafers W of two different types in different lots, the probe cards 5 adaptable to the respective lots are mounted on the respective exploration portions 2, and then the different semiconductor wafers W are assigned to the respective exploration portions 2. Thus, the semiconductor wafers W in the different lots can be simultaneously explored. In the foregoing case, if the semiconductor wafers W in the different lots are accommodated in one cassette C or if the same are accommodated in different cassettes C, the first delivery and acceptance mechanism 13 is controlled by the control unit 60 to automatically assign the semiconductor wafers W in the cassette C to the exploration portions 2 depending upon the lots. An example of the sequential exploration operation is explained with a flow chart shown in FIG. 11. The basic flow is the same as that shown in FIG. 10. Referring to FIG. 11, symbols STG1 represent the left-hand exploration portion 2 and STG2 represent the right-hand exploration portion 2.

With the probe system 1 having the foregoing structure, even if the electrical characteristics explored by the exploration portion 2 cannot satisfy the determined characteristics, the defective semiconductor wafers W can be accommodated in a reject carrier, which is individually provided, by the first delivery and acceptance mechanism 13. An example of the sequential exploration operations is shown in a flow chart shown in FIG. 12. The basic flow is the same as that shown in FIG. 10.

Figure 13A:
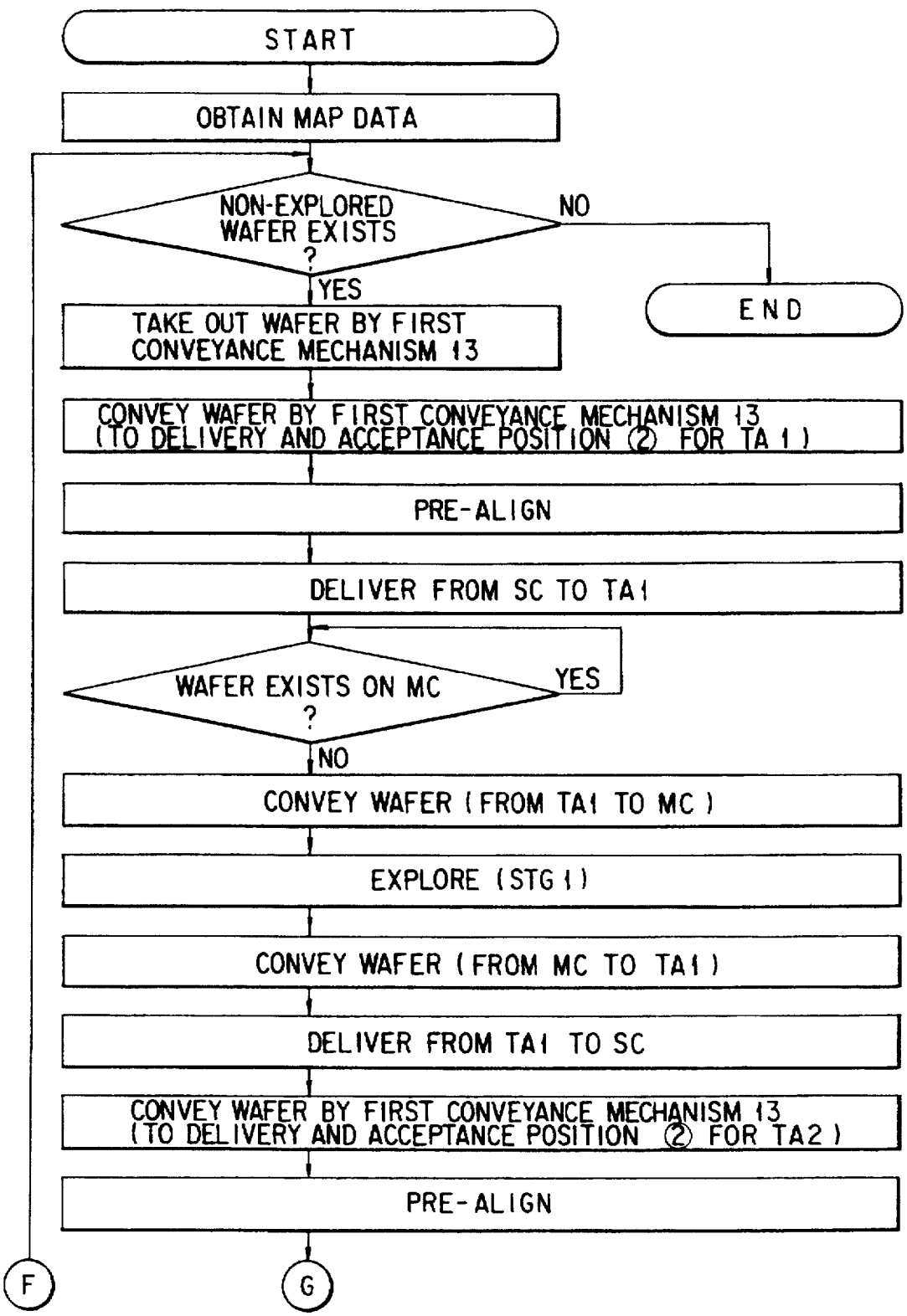
FIG. 13A is a flow chart showing the first phase of the fourth operations of the probe system shown in FIG. 1.
Figure 13B:
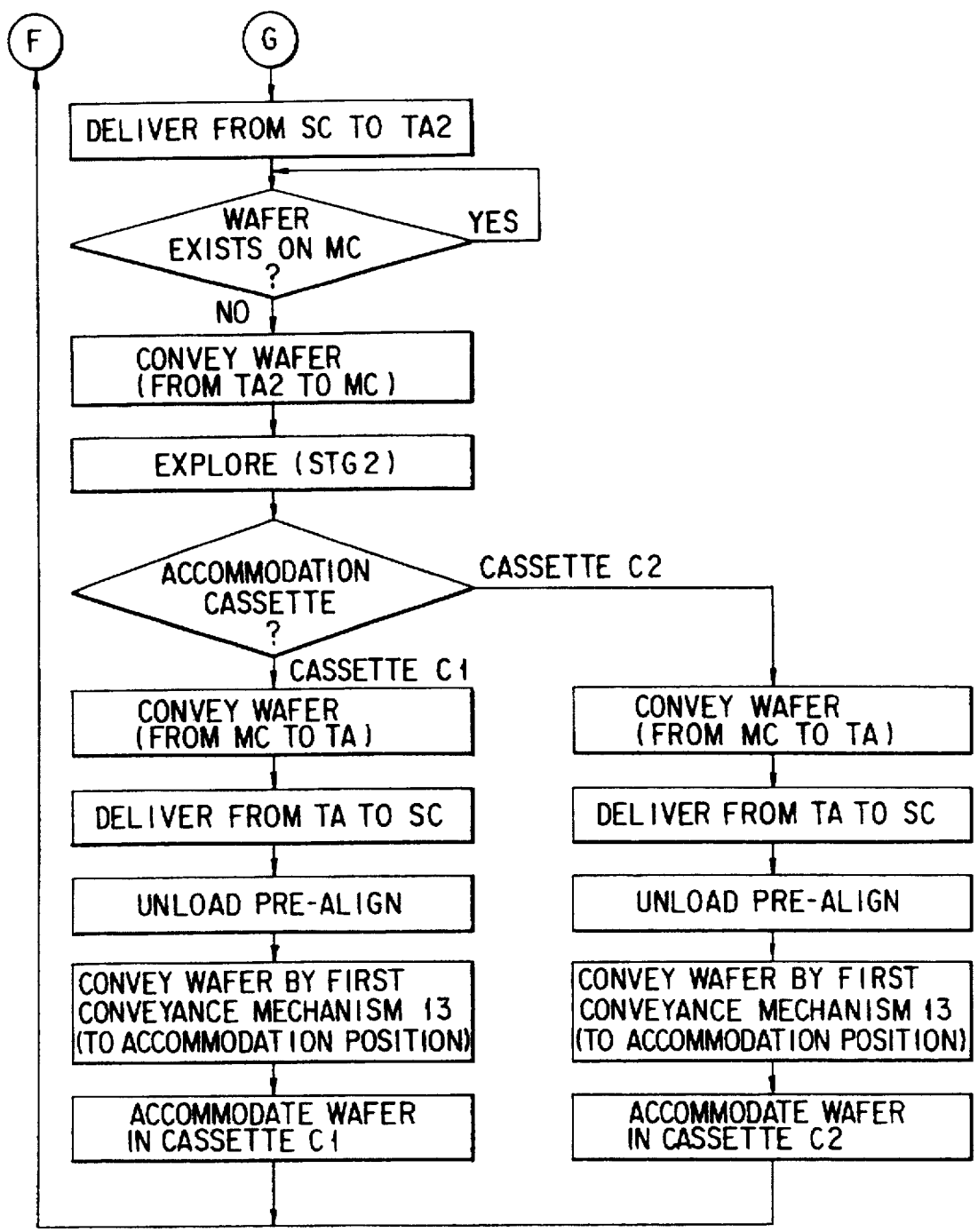
FIG. 13B is a flow chart showing the remaining phase of the fourth operations of the probe system shown in FIG. 1.

With the foregoing probe system 1 having the foregoing structure, an operation may be performed such that a predetermined electrical characteristic exploration of the semiconductor wafer W is performed by the left-hand exploration portion 2 and then another electrical characteristic exploration of the same is performed by the right-hand exploration portion 2. That is, two electrical characteristics of the semiconductor wafer W can be explored individually by the right-hand and left-hand exploration portions 2. An example of the foregoing exploration operation is explained with a flow chart shown in FIG. 13. The basic flow is the same as that shown in FIG. 10. Referring to FIG. 13, symbols TA1 represent the second delivery and acceptance mechanism 23 adjacent to the left-hand exploration portion 2, TA2 represent the second delivery and acceptance mechanism 23 adjacent to the right-hand exploration portion 2, C1 represent the left-hand cassette and C2 represent the right-hand cassette.

As described above, the probe system 1 according to this embodiment has the structure such that the two retainer mechanisms 10, on which the cassettes C are placed, are provided so as to be capable of elevating, the conveyance rail 11 extending along the front surfaces of the two exploration portions 2 is disposed below the retainer mechanisms 10 and the first delivery and acceptance mechanism 13 for delivering and receiving the semiconductor wafers W between the retainer mechanisms 10 and the exploration portions 2 is movably provided for the conveyance rail 11. That is, the two exploration portions 2 share the conveyance rail 11 and the first delivery and acceptance mechanism 13, the retainer mechanisms 10 (10A) are opposite to the rail 11 and elevate vertical with respect to the rail 11 at a position above the rail 11. Therefore, the space in a clean room required to install the probe system 1 can be reduced. As a result, space and cost reductions can be achieved.

In the probe system 1 according to this embodiment, the first delivery and acceptance mechanism 13 is able to move between the two retainer mechanisms 10 and the two exploration portions 2 along the conveyance rail 11. Therefore, in a case where semiconductor wafers W in different lots, that is, semiconductor wafers W to be explored respectively, are explored simultaneously, (in a case where the semiconductor wafers W in the left-hand cassette C and those in the right-hand cassette C must be explored respectively), the two exploration portions 2 can effectively be used while preventing leaving of either exploration portion 2. Thus, the efficiency in exploring the semiconductor wafers W can be improved. As a matter of course, even if semiconductor wafers W of two types are stored in one cassette C, the semiconductor wafers W in different lots can be assigned to the two exploration portions 2 by the first delivery and acceptance mechanism 13. Therefore, the adoptability of the apparatus can be improved and the exploration can efficiently be performed. In the probe system 1 according to this embodiment, the sub-chuck 20 pre-aligns the semiconductor wafer W during the movement of the first delivery and acceptance mechanism 13 from the retainer mechanisms 10 to the second delivery and acceptance mechanism 23 of the exploration portions 2. Therefore, the efficiency in the exploration operation can significantly be improved.

In the probe system 1 according to this embodiment, the swing drive mechanism 9 for swinging the two test heads 6 is disposed in the space between the adjacent exploration portions 2. That is, the exploration portions 2 share the swing drive mechanism 9. Therefore, the size of the probe system 1 can be reduced and, thus, the space can be further reduced.

Since the probe system 1 according to this embodiment has the sub-chuck 20, which aligns the semiconductor wafer W to a predetermined direction, and which is provided for the first delivery and acceptance mechanism 13, one sub-chuck 20 can be decreased. Thus, the space can be reduced. Since the probe system 1 according to this embodiment has the structure such that the conveyance rail 11 and the first delivery and acceptance mechanism 13 are covered with the transparent cover 38, the first delivery and acceptance mechanism 13 can be monitored from outside.

In a case where the probe system 1 having the foregoing structure is increased, a plurality of the probe systems 1 are adjacently disposed; and the conveyance rails 11 of the adjacent probe systems 1 are connected to each other through relay conveyance rail 11A, as shown in FIG. 1. Thus, the conveyance rails 11 of the two probe systems 1 can be formed integrally. Therefore, the first delivery and acceptance mechanism 13 can be shared by the two probe systems 1. An applicable example, in which the first delivery and acceptance mechanism 13 is shared by the two probe systems, is, as a second embodiment of the present invention, shown in FIGS. 14 to 17.

Figure 14:
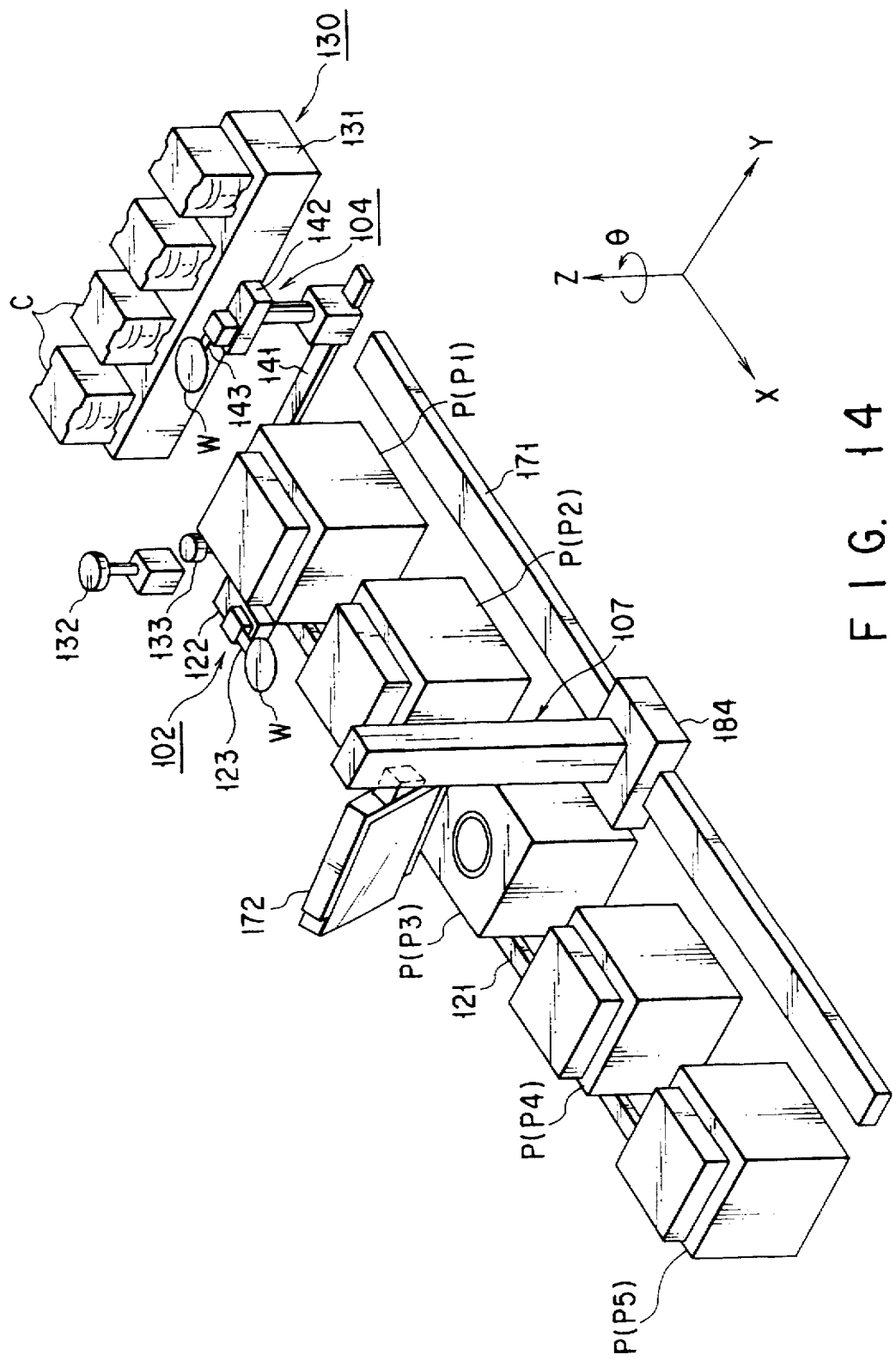
FIG. 14 is a perspective view showing a probe system according to a second embodiment of the present invention.
Figure 15:
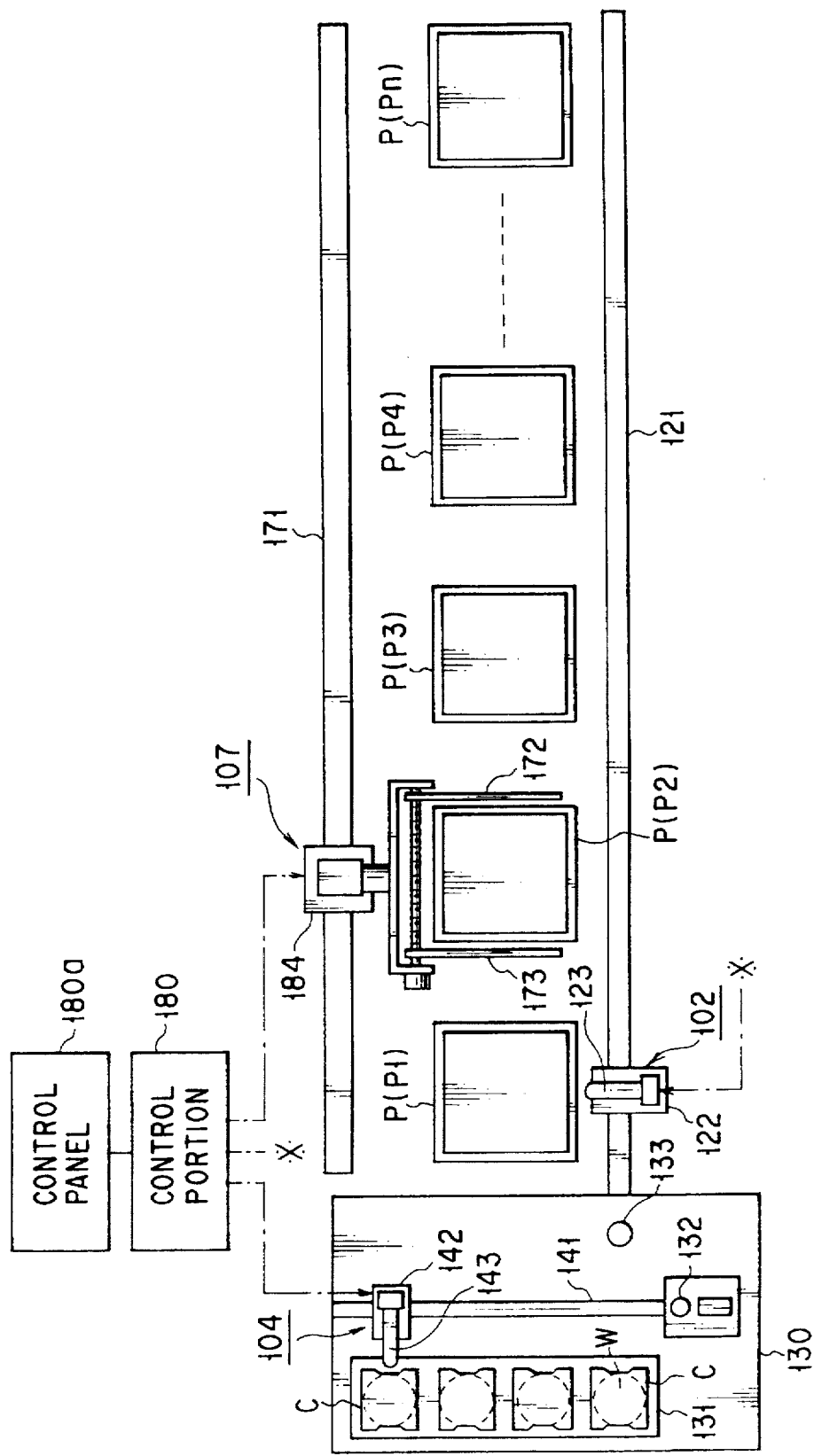
FIG. 15 is a plan view showing the overall structure of the probe system shown in FIG. 14.

As shown in FIGS. 14 and 15, the probe system according to the second embodiment has the structure such that a plurality of exploration portions P (P1, P2, . . . , Pn) are disposed to form a line while being apart from one another by predetermined intervals along a movement passage 171 of a test head holding mechanism 107 extending in the direction of the X axis, to be described later. In front of the probe apparatuses P (in the deep portion of FIG. 14 and in the lower portion of FIG. 15), there is formed a conveyance passage 121 comprising, for example, a rail, disposed along the line of the probe apparatuses P. A first wafer-conveyance mechanism 102 is movably provided for the conveyance passage 121. The first wafer-conveyance mechanism 102 has a conveyance portion 122 which is moved due to a guiding effect of the conveyance passage 121 and which is able to rotate in a direction θ (around the Z axis); and an arm 123 which has a portion provided in the conveyance portion 122 and which can be thrust therefrom.

At an end of the line of the probe apparatuses P, there is disposed a loader/unloader portion 130 in which wafers W are delivered and accepted. The loader/unloader portion 130 has a cassette stage 131 for arranging a plurality of wafer cassettes C (four wafer cassettes C are illustrated for convenience) in a line and placing the same. A conveyance passage 141 comprising, for example, a rail, is disposed adjacent to the probe apparatuses P to face the cassette stage 131. The conveyance passage 141 has a movable second wafer-conveyance mechanism 104. The second wafer-conveyance mechanism 104 has a conveyance portion 142 which is moved while being guided along the conveyance passage 141 and which is able to move in the directions of Z axis and θ; and an arm 143 which has a portion provided in the conveyance portion 142 and which can be thrust therefrom.

At an end of the conveyance passage 141, there is disposed an alignment stage 132 for aligning the orientation flat portion of the wafer W. Between the conveyance passage 121 and the conveyance passage 141, there is disposed an intermediate delivery and acceptance stage 133 for delivering and accepting the wafer W between the first wafer-conveyance mechanism 102 and the second wafer-conveyance mechanism 104.

Figure 16:
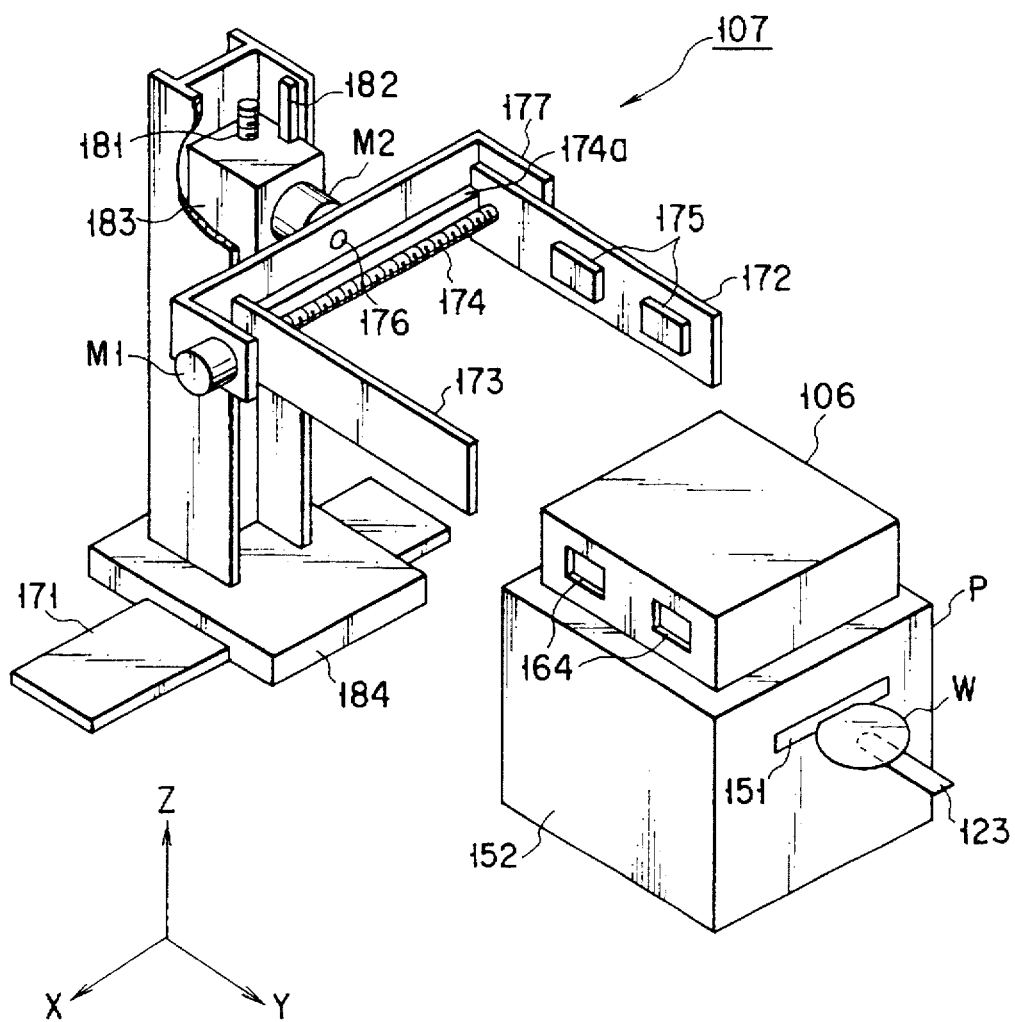
FIG. 16 is a perspective view showing a test head holding mechanism and a probe apparatus of the probe system shown in FIG. 14.

The probe apparatus P (P1 to Pn), as shown in FIGS. 16 and 17, comprises a frame 152 having a conveyance port 151 in the front surface thereof; a probe card 153 disposed in the frame 152; a wafer retainer frame 154 capable of moving in the directions of the X axis, Y axis, Z axis and θ in a region below the probe card 153; and a test head 106 placed on the top of the frame 152 and aligned by a guide 160. The probe card 153 has, on the lower surface thereof, a probe 155 for example, the probe card 153 being attached to the frame 152 through an insert ring 156.

The test head 106 has, on the lower surface thereof, a performance board 161. A plurality of electrodes of the performance board 161 are electrically connected to a plurality of electrodes of the probe card 153 through pins 163 of the contact ring 162. The pins 163 of the contact ring 162 are always urged in the projecting direction by springs. Recesses 164, to be engaged to arms 172 and 173 of a test head holding mechanism 107, to be described later, are formed in the side surfaces of the test head 106. Each test head 106 of the probe apparatuses P (P1 to Pn) is connected to a tester (not shown) capable of transmitting/receiving data to and from a plurality of the test heads 106.

As shown in FIGS. 14 and 15, a movement passage 171 comprising, for example, a rail, extends in the direction of the X axis on the rear side of the probe apparatuses P. The test head holding mechanism 107 capable of moving along the movement passage 171 is attached to the movement passage 171. As shown in FIG. 16, the test head holding mechanism 107 has a pair of arms 172 and 173 for holding the two sides of the test head 106. The foregoing arms 172 and 173 are, by threads, engaged to a ball screw 174 having thread portions at the two ends thereof in which threads are formed in opposite directions and arranged to be rotated by motor M1. Therefore, the distance between the arms 172 and 173 can be changed by the rotation of the ball screw 174 while being guided by the guide 174a. The arms 172 and 173 have, on the inner surfaces thereof, projections 175 to be engaged to recesses 164 formed on the side surfaces of the test head 106. Due to engagement between the recesses 164 and the projections 175, the arms 172 and 173 for holding the test head 106 are enabled to strongly hold the test head 106. On the outsides of the arms 172 and 173, there is disposed a support frame 177 which supports the ball screw 174 and the guide 174 and which is capable of rotating around a horizontal shaft 176 running parallel to the Y axis by motor M2.

The motor M2 is attached to an elevation member 183 which is moved upwards/downwards due to rotation of a ball screw 181 while being guided by a guide 182. The ball screw 181 is held by a movement base 184 which is moved while being guided by the guide rail 171. Note that a portion (not shown) for driving the ball screws 181 and the base 184 and rotations of the motors M1 and M2 are, as shown in FIG. 15, controlled by a control portion 180 in response to, for example, a control signal supplied from a control panel 180a.

To stop the movement base 184 at a position at which the movement base 184 faces each of the probe apparatuses P, a light emitting portion is attached to a predetermined position of each of the probe apparatuses P and a light receiving portion corresponding to all of the light emitting portions so as to be capable of receiving light from the light emitting portion of each probe apparatus P is attached to the test head holding mechanism 107. In the foregoing structure, the control portion 180 detects the light receiving portion among all of the light receiving portions which is receiving light to determine the probe apparatus P to which the movement base 184 faces to control such that the movement base 184 is stopped at a position to face the object probe apparatus P. Moreover, the control portion 180 controls the operations of the first and second wafer-conveyance mechanisms 102 and 104 in accordance with a predetermined program.

The operation of the probe system having the foregoing structure will now be described. Initially, the second wafer-conveyance mechanism 104 takes out one wafer W from the cassette C on the cassette stage 131 of the loader portion 130. The second wafer-conveyance mechanism 104 conveys the wafer W to the alignment stage 132 to orient the orientation flat portion of the wafer W. Then, the second wafer-conveyance mechanism 104 delivers the pre-aligned wafer W to a relay stage 133. Then, the first wafer-conveyance mechanism 102 receives the wafer W on the relay stage 133. Then, the wafer W is moved to a position in front of the probe apparatus P (for example, the probe apparatus P3) by the first wafer-conveyance mechanism 102. Then, the wafer W is received by the wafer retainer frame 154 in the frame 152 through the conveyance port 151 of the probe apparatus P3. The foregoing delivery and acceptance operation is performed by the arm 123 of the first wafer-conveyance mechanism 102.

The wafer W is delivered and accepted among the first wafer-conveyance mechanisms 102 and 104, the stages 132 and 133 and the wafer retainer frame 154 by using, for example, holding pins provided on the top surfaces of the stages 132 and 133 and the wafer retainer frame 154 in such a manner that the holding pins are able to project over the foregoing top surfaces.

Then, the wafer W and the probe 155 are aligned by the wafer retainer frame 154, and then the wafer retainer frame 154 is moved upwards so that an electrode pad of the IC chip on the wafer W and the probe 155 are brought into electrically contact with each other. In the foregoing state, a signal is transmitted and received between the test head 106 and the IC chip on the wafer W through the probe card 153. Then, a tester (not shown) connected to the test head 106 explores the IC chip. Note that the alignment of the wafer W using the wafer retainer frame 154 is performed such that, for example, the wafer W and the probe 155 are brought into contact with each other; and the trace of the probe 155 is observed by a microscope (not shown) and the positions of the wafer retainer frame 154 in the directions of the X axis, Y axis and θ are adjusted in accordance with the result of the observation.

Due to a stepping operation of the wafer retainer frame 154, the IC chips on the wafers W are sequentially explored as described above. After explorations of all of the IC chips have been completed, the wafers W are taken out from the wafer retainer frame 154 by the first wafer-conveyance mechanism 102. Then, the wafer W is returned to the original cassette C through the relay stage 133 and the second wafer-conveyance mechanism 104 due to an operation contrary to the foregoing operation.

When the probe card 153 is changed, the performance board is changed or maintenance of the test head 106 is performed, the test head holding mechanism 107 is moved along the movement passage 171 by, for example, the control panel 180a through the control portion 180 so as to be stopped at a position, at which the change is performed or a position to face a probe apparatus P which is the subject of the maintenance. At this time, the arms 172 and 173 are positioned right above the test head 106 while being made to be level states. In the foregoing state, the ball screw 181 is rotated to downwards move the arms 172 and 173 of the test head holding mechanism 107, and the motor M1 is rotated so that the arms 172 and 173 hold the test head 106. Then, the arms 172 and 173 are again moved upwards to move the test head 106 in the direction of the Z axis. Then, in a state where the test head holding mechanism 107 has been somewhat moved in the direction of the X axis for example, the motor M2 is rotated so as to rotate the arms 172 and 173 around the horizontal shaft 176. Thus, the test head 106 is stood erect as indicated by an alternate long and short dash line shown in FIG. 17. In the foregoing state, a predetermined changing operation or a maintenance operation is performed. If necessary, the test head holding mechanism 107 is, at this time, moved in the direction of the X axis while holding the test head 106. After the predetermined changing or maintaining operation has been completed, the test head holding mechanism 107, due to an operation contrary to the foregoing operation, places the test head 106 on the body of the probe apparatus P.

As described above, since the test head 106 is simply placed on the probe apparatus P in the probe system according to this embodiment, a necessity of providing a large-scale mechanism for holding the test head 106, for example, a hinge mechanism and a balancer, for each probe apparatus P can be eliminated. Therefore, the size of the probe apparatus P can be reduced and the test head holding mechanism 107 can be shared by a plurality of the probe apparatuses P. As a result, the space and cost can be reduced. In particular, a significant effect can be obtained in a case where the number of the probe apparatuses P is large.

Since the probe system according to this embodiment has the structure such that the test head holding mechanism 107 is moved along the movement passage 171 in response to the control signal supplied from the control portion 180 to be stopped at a predetermined position and then the test head 106 is automatically removed from the probe apparatus P, the load to be borne by an operator can be reduced.

A modification of the probe system according to this embodiment will now be described. In this case, the cassette C storing the wafers W is conveyed from the loader/unloader portion 130 to a position in front of the probe apparatus P by the cassette conveyance mechanism; and the wafers W are delivered and received between the cassette C and the wafer retainer frame by a wafer conveyance mechanism disposed adjacent to the probe apparatus P. Another modification may be employed in which the operation of the test head holding mechanism 107 is performed by, for example, a remote controller. In the foregoing case, an operator monitors the state of the operation near the test head holding mechanism 107 and operates the test head holding mechanism 107. In anther modification, the test head holding mechanism 107 is formed into a rail-less automatic conveyance mechanism which is automatically controlled in accordance with wireless communication with the control portion 180.

Each of the rail for forming the conveyance passage 121 of the first wafer-conveyance mechanism 102 and the rail for forming the movement passage 171 of the test head holding mechanism 107 is not required to be one continuous rail. By preparing a plurality of short rails to be enabled to be increased for each probe apparatus P and by connecting the short rails to be adaptable to the number of the probe apparatuses P, the probe apparatuses P can easily be increased. By preparing a plurality of first wafer-conveyance mechanisms 102 and by providing a relay stage in the conveyance passage 121, deliver and acceptance of the wafer W may be performed between one first wafer-conveyance mechanism 102 and another first wafer-conveyance mechanism 102. In the foregoing case, time required to convey the wafer W can be shorted even if the number of the probe apparatuses P is large.

Although this embodiment has the structure such that the probe apparatuses P are disposed in a line, a repair apparatus, a marking apparatus, a visual inspection apparatus and so forth may be included in the line of the probe apparatuses P.

FIG. 18 shows a third embodiment of the present invention. This embodiment is identical with the first embodiment, except that it has no component equivalent to the swing drive mechanism, that is, a probe system according to this embodiment has a structure such that a plurality of component systems 1' of the probe system 1 according to the first embodiment but excluding the swing drive mechanism 9 are disposed adjacently. Moreover, conveyance rails 11 of the adjacent systems 1' are connected to each other through a relay conveyance rail 11A. Referring to FIG. 18, a plurality of the conveyance rails 11 connected by the relay conveyance rails 11A are illustrated in the form of one conveyance rail 11. To simplify the illustration, some mechanisms, such as the retainer mechanism 10, are omitted from illustration. As a matter of course, the conveyance rail 11 is disposed to correspond to the lower portion of the retainer mechanism 10.

Each probe system 1' shares one first delivery and acceptance mechanism 13 which is capable of moving the conveyance rail 11. The test head 6 is, similarly to the test head 106 according to the second embodiment, simply placed on the exploration portion 2 while being electrically connected to the electrodes of the probe card 5. A movement passage 171, comprising, for example, a rail, extends in the direction of the X axis on the rear side of the probe apparatus P which opposes the conveyance rail 11. A test head holding mechanism 107 capable of moving along the movement passage 171 and having the same structure as that of the test head holding mechanism 107 according to the second embodiment is attached to the movement passage 171.

As described above, the probe system according to this embodiment has advantages of the probe system according to the first embodiment and that according to the second embodiment.

Note that the probe system according to the present invention is not limited to the foregoing embodiments. The probe system according to the present invention may be employed to explore liquid crystal substrates and the like as well as exploring the semiconductor wafers W.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A probe system for exploring electrical characteristics of a subject, comprising:

a plurality of exploration portions, aligned a predetermined distance apart from one another and each having a test head, for exploring electrical characteristics of the subject by electrically connecting the test head to electrodes of the subject;

a conveyance passage extending parallel to a direction in which the exploration portions are aligned;

at least one retainer portion, arranged directly above the conveyance passage and opposing the exploration portions, for retaining a plurality of subjects, the retainer portion moving vertically in a direction perpendicular to an extending direction of the conveyance passage to approach the conveyance passage;

at least one delivering/accepting mechanism moving along the conveyance passage, for passing the subject between the retainer portion and each of the exploration portions.

2. A probe system according to claim 1, further comprising:

a retainer chuck arranged in each of the exploration portions and having a surface for holding the subject on, for moving the subject placed on the surface to an exploration position where the subject is electrically connected with the test head; and a transporting mechanism arranged on each of the exploration portions, having a first arm for receiving to-be-explored subject from the delivering/accepting mechanism and passing the to-be-explored subject onto the retainer chuck, and a second arm for receiving an explored subject from the retainer chuck and returning the explored subject to the delivering/accepting mechanism.

3. A probe system according to claim 2, further comprising control means for controlling the driving of the retainer portion, the delivering/accepting mechanism and the transporting mechanism such that the to-be-explored subject is sequentially carried by the delivering/accepting mechanism from the retainer portion to the first arm arranged on each of the exploration portions when an exploring operation is being performed on at least one exploration portion.

4. A probe system according to claim 3, wherein said control means controls the driving of the exploration portions including the transporting mechanism and the retainer chuck to initiate the exploring operation sequentially from an exploration portion which has received the to-be-explored subject on the first arm.

5. A probe system according to claim 3, wherein said control means controls the driving of the retainer portion, the delivering/accepting mechanism and the transporting mechanism such that the delivering/accepting mechanism starts passing, sequentially from an exploration portion which has passed the explored subject to the second arm, the explored subject from the second arm to the retainer portion.

6. A probe system according to claim 4, wherein said control means controls the driving of the retainer portion, the delivering/accepting mechanism and the transporting mechanism such that the delivering/accepting mechanism starts passing, sequentially from an exploration portion which has passed the explored subject to the second arm, the explored subject from the second arm to the retainer portion.

7. A probe system according to claim 1, wherein said delivering/accepting mechanism includes alignment means for orienting the received subject into a predetermined direction.

8. A probe system according to claim 7, wherein said alignment means orients the received subject into the predetermined direction while the delivering/accepting mechanism is moving between the retaining portion and one of the exploration portions.

9. A probe system according to claim 1, wherein the exploration portions share a single delivering/accepting mechanism.

10. A probe system according to claim 1, wherein at least the delivering/accepting mechanism and the conveyance passage are covered with a transparent cover.

11. A probe system according to claim 1, wherein said conveyance passage includes a plurality of rails, each rail being detachably connected to one another.

12. A probe system according to claim 1, wherein the test head is detachably arranged with respect to an exploration portion.

13. A probe system according to claim 12, further comprising a test head attaching/detaching mechanism for attaching and detaching the test head with respect to the exploration portion.

14. A probe system according to claim 13, wherein said test head attaching/detaching mechanism transports the test head between an exploration position where the test head is attached to the exploration portion and electrically connected with the electrodes of the subject and a standby position where the test head is detached from the exploration portion.

15. A probe system according to claim 14, wherein said test head attaching/detaching mechanism is arranged in a space between two adjacent exploration portions and includes a swing mechanism for swinging the test head.

16. A probe system according to claim 14, wherein said test head attaching/detaching mechanism moves along the direction in which the exploration portions are aligned and includes a holding mechanism for holding the test head.

17. A probe system according to claim 14, wherein said standby position is away from the exploration position by a distance which allows maintenance of the exploration portion.

* * * * *